US012659680B2

(12) United States Patent (10) Patent No.: US 12,659,680 B2
Katayama et al. (45) Date of Patent: Jun. 16, 2026

(54) SEMICONDUCTOR DEVICE AND ELECTRONIC APPARATUS

(71) Applicant: SEIKO EPSON CORPORATION, Tokyo (JP)

(72) Inventors: Takao Katayama, Matsumoto (JP); Akihiro Fukuzawa, Hino (JP); Isamu Moriya, Chino (JP)

(73) Assignee: SEIKO EPSON CORPORATION (JP)

( * ) Notice: Subject to any disclaimer, the term of this patent is extended or adjusted under 35 U.S.C. 154(b) by 120 days.

(21) Appl. No.: 18/783,617

(22) Filed: Jul. 25, 2024

(65) Prior Publication Data

US 2025/0039621 A1 Jan. 30, 2025

(30) Foreign Application Priority Data

Jul. 28, 2023 (JP) ................................. 2023-123155

(51) Int. Cl.
H04R 29/00 (2006.01)
H03F 1/52 (2006.01)
(Continued)

(52) U.S. Cl.
CPC .............. H04R 29/00 (2013.01); H03F 1/52 (2013.01); H03F 1/56 (2013.01); H03F 3/2171 (2013.01);
(Continued)

(58) Field of Classification Search
CPC ...... H04R 29/00–003; H03F 1/52; H03F 1/56
See application file for complete search history.

(56) References Cited

U.S. PATENT DOCUMENTS 7,262,658 B2    8/2007   Ramaswamy et al.
2012/0294450 A1*  11/2012   Ozcan .................. H04R 29/001
                                                     381/59
(Continued)

FOREIGN PATENT DOCUMENTS

JP          H01-176952 A      7/1989
JP          2005-202624 A     7/2005
(Continued)

*Primary Examiner* — James K Mooney
(74) *Attorney, Agent, or Firm* — Harness, Dickey & Pierce, P.L.C.

(57) ABSTRACT

A semiconductor device includes: a test signal generation circuit that modulates a test signal to generate fifth and sixth modulated signals; a first amplification circuit that outputs a third and fourth amplified signals that are obtained by amplifying the fifth and sixth modulated signal to the first and second output terminal; a second amplification circuit that outputs seventh and eighth amplified signal s that are obtained by amplifying the fifth and sixth modulated signals to the third and fourth output terminals; a first peak frequency detection circuit that measures a potential difference between the first and second output terminals to detect a first peak frequency; a second peak frequency detection circuit that measures a potential difference between the third and fourth output terminals to detect a second peak frequency; and a determination circuit that determines whether or not a difference between the first and second peak frequency is included in a predetermined reference frequency difference range.

7 Claims, 16 Drawing Sheets

(51) Int. Cl.

| | | |
|---|---|---|
| *H03F 1/56* | (2006.01) | |
| *H03F 3/217* | (2006.01) | |
| *H03M 1/10* | (2006.01) | |
| *H04R 3/04* | (2006.01) | |

(52) U.S. Cl.
CPC ............ *H03M 1/1071* (2013.01); *H04R 3/04* (2013.01); *H03F 2200/03* (2013.01); *H03F 2200/351* (2013.01); *H04R 2430/01* (2013.01)

(56) References Cited

U.S. PATENT DOCUMENTS

| | | | |
|---|---|---|---|
| 2019/0028805 A1 | 1/2019 | Goto | |
| 2020/0081684 A1 | 3/2020 | Akahori | |
| 2020/0236482 A1 | 7/2020 | Akahori | |
| 2023/0327617 A1* | 10/2023 | Matsuyama | H03F 3/2175 |
| | | | 330/251 |

FOREIGN PATENT DOCUMENTS

| | | | |
|---|---|---|---|
| JP | 2012-199854 A | 10/2012 | |
| JP | 2020-022055 A | 2/2020 | |
| JP | 2020-041953 A | 3/2020 | |
| JP | 2020-120243 A | 8/2020 | |
| WO | 2017-164380 A1 | 9/2017 | |

* cited by examiner

SEMICONDUCTOR DEVICE AND ELECTRONIC APPARATUS

The present application is based on, and claims priority from JP Application Serial Number 2023-123155, filed Jul. 28, 2023, the disclosure of which is hereby incorporated by reference herein in its entirety.

BACKGROUND

1. Technical Field

The present disclosure relates to a semiconductor device and an electronic apparatus.

2. Related Art

JP-A-2012-199854 discloses a speaker failure notification device that measures an impedance that changes with a structural change of a speaker by a control section, determines whether or not the measured impedance is within a predetermined range, and notifies that the speaker fails when it is determined that the impedance is not within the range.

In the speaker failure notification device disclosed in JP-A-2012-199854, since it is determined whether or not the measured impedance is within the predetermined range, when the impedance of the speaker changes due to a change in a temperature, there is a risk that the failure of the speaker cannot be determined correctly.

SUMMARY

According to an aspect of the present disclosure, there is provided a semiconductor device including: a first output terminal coupled to a first terminal of a first sound reproduction device; a second output terminal coupled to a second terminal of the first sound reproduction device; a third output terminal coupled to a first terminal of a second sound reproduction device; a fourth output terminal coupled to a second terminal of the second sound reproduction device; a first modulation circuit that, in a first operation mode, modulates a signal based on a first sound source signal to output a first modulated signal and a second modulated signal; a second modulation circuit that, in the first operation mode, modulates a signal based on a second sound source signal to output a third modulated signal and a fourth modulated signal; a test signal generation circuit that, in a second operation mode, modulates a test signal of which a frequency is changed in a frequency band set in advance, to generate a fifth modulated signal and a sixth modulated signal; a first amplification circuit that, in the first operation mode, outputs a first amplified signal obtained by amplifying the first modulated signal to the first output terminal and outputs a second amplified signal obtained by amplifying the second modulated signal to the second output terminal and that, in the second operation mode, outputs a third amplified signal obtained by amplifying the fifth modulated signal to the first output terminal and outputs a fourth amplified signal obtained by amplifying the sixth modulated signal to the second output terminal; a second amplification circuit that, in the first operation mode, outputs a fifth amplified signal obtained by amplifying the third modulated signal to the third output terminal and outputs a sixth amplified signal obtained by amplifying the fourth modulated signal to the fourth output terminal and that, in the second operation mode, outputs a seventh amplified signal obtained by amplifying the fifth modulated signal to the third output terminal and outputs an eighth amplified signal obtained by amplifying the sixth modulated signal to the fourth output terminal; a first peak frequency detection circuit that, in the second operation mode, measures a potential difference between the first output terminal and the second output terminal to detect a first peak frequency that is a frequency of the test signal at which an impedance of the first sound reproduction device reaches a peak; a second peak frequency detection circuit that, in the second operation mode, measures a potential difference between the third output terminal and the fourth output terminal to detect a second peak frequency that is a frequency of the test signal at which an impedance of the second sound reproduction device reaches a peak; and a determination circuit that determines whether or not a difference between the first peak frequency and the second peak frequency is included in a predetermined reference frequency difference range.

According to an aspect of the present disclosure, there is provided an electronic apparatus including: the semiconductor device according to the above-described aspect; the first sound reproduction device; and the second sound reproduction device.

DESCRIPTION OF EMBODIMENTS

Hereinafter, a preferred embodiment of the present disclosure will be described in detail with reference to the accompanying drawings. The following embodiment does not inappropriately limit the contents of the present disclosure described in the claims. Not all of the configurations described below are essential components of the present disclosure.

1. Semiconductor Device

1-1. Embodiment

1-1-1. Configuration of Semiconductor Device

Figure 1:
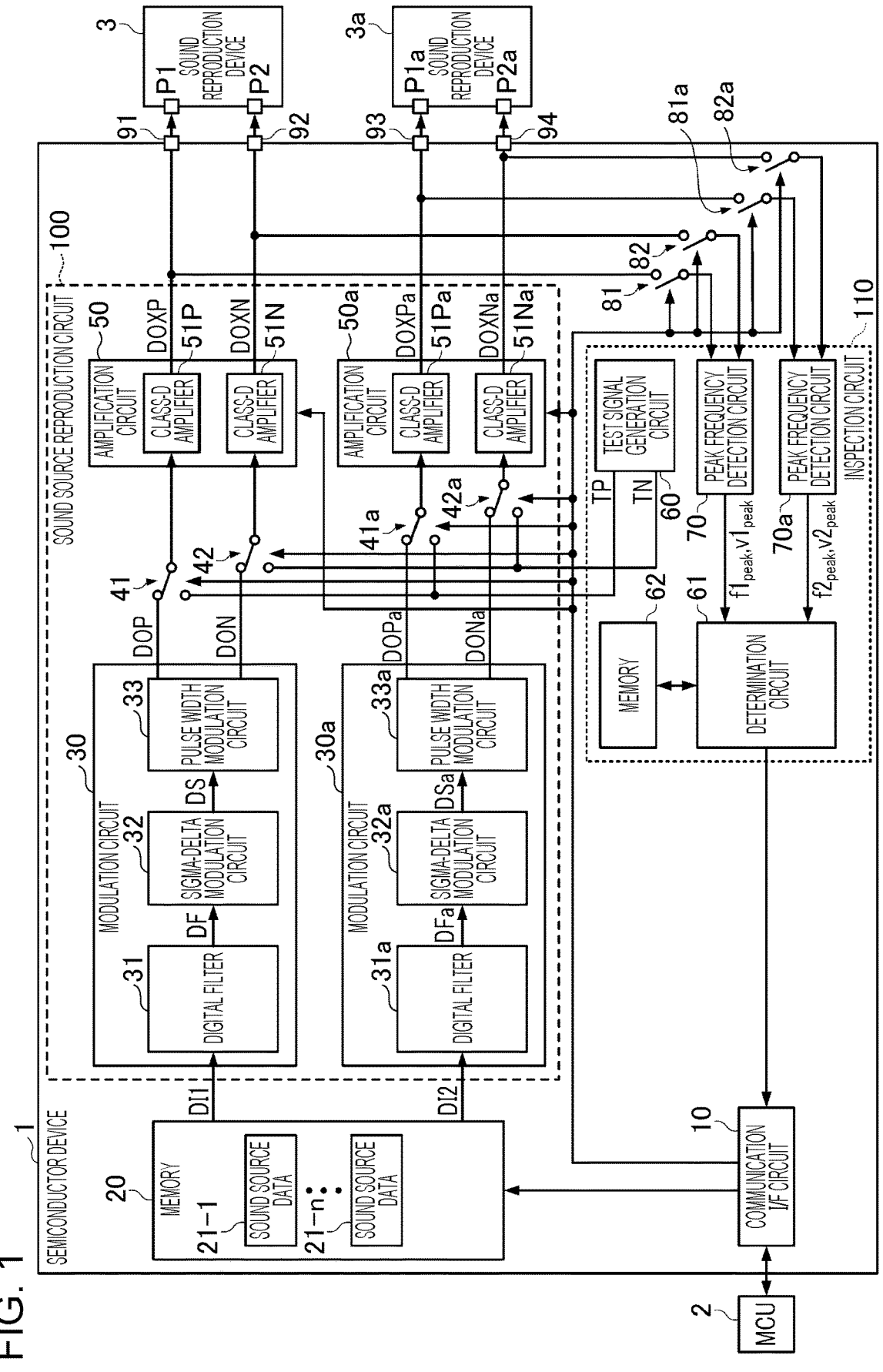
FIG. 1 is a diagram illustrating a configuration example of a semiconductor device according to the present embodiment.

FIG. 1 is a diagram illustrating a configuration example of a semiconductor device according to the present embodiment. As illustrated in FIG. 1, the semiconductor device 1 according to the present embodiment includes a communication interface circuit 10, a memory 20, switches 81, 81a, 82, and 82a, a sound source reproduction circuit 100, and an inspection circuit 110. The semiconductor device 1 is coupled to sound reproduction devices 3 and 3a. The semiconductor device 1 may be a semiconductor integrated circuit device of one chip, may be configured as a semiconductor integrated circuit device of a plurality of chips, or may be configured such that at least a part thereof is configured with an electronic component other than the semiconductor integrated circuit device.

The semiconductor device 1 has two operation modes of a normal operation mode and an inspection mode. The normal operation mode is an operation mode in which the sound reproduction devices 3 and 3a reproduce a sound. The inspection mode is an operation mode for determining states of the sound reproduction devices 3 and 3a.

The memory 20 stores n pieces of sound source data 21-1 to 21-n. n is an integer of 1 or more. The memory 20 may be, for example, a flash memory. Each of the sound source data 21-1 to 21-n may be, for example, pulse code modulated audio data or adaptively difference pulse code modulated audio data. The sound source data 21-1 to 21-n may be, for example, data that is a basis for an audio imitating a voice when a human speaks, or various sounds such as a mechanical warning sound or an effect sound.

The communication interface circuit 10 is a circuit that performs data communication with a micro control unit 2. The communication interface circuit 10 may be, for example, an SPI interface circuit or an I2C interface circuit. SPI is an abbreviation for Serial Peripheral Interface, and I2C is an abbreviation for Inter-Integrated Circuit.

The communication interface circuit 10 receives various commands transmitted from the micro control unit 2 and generates various control signals corresponding to the received commands. For example, when a command to switch the operation mode of the semiconductor device 1 to the normal operation mode or the inspection mode is received, the communication interface circuit 10 generates a control signal for switching the coupling of switches 41, 41a, 42, 42a, 81, 81a, 82, and 82a depending on the operation mode. In addition, for example, when a sound source reproduction command for causing the sound reproduction device 3 to reproduce sound source data 21-i is received, the communication interface circuit 10 reads the sound source data 21-i from the memory 20, inputs the sound source data 21-i to the sound source reproduction circuit 100 as a sound source signal DI1, and instructs the sound source reproduction circuit 100 to perform the reproduction via the sound reproduction device 3. The sound source data 21-i is any one of the sound source data 21-1 to 21-n stored in the memory 20. In addition, for example, when a sound source reproduction command for causing the sound reproduction device 3a to reproduce sound source data 21-j is received, the communication interface circuit 10 reads the sound source data 21-j from the memory 20, inputs the sound source data 21-j to the sound source reproduction circuit 100 as a sound source signal DI2, and instructs the sound source reproduction circuit 100 to perform the reproduction via the sound reproduction device 3a. The sound source data 21-j is any one of the sound source data 21-1 to 21-n stored in the memory 20. Further, for example, when a sound source stop command for the sound source data 21-i or the sound source data 21-j being reproduced is received, the communication interface circuit 10 instructs the sound source reproduction circuit 100 to stop the reproduction. Further, for example, when various setting commands related to the sound source reproduction are received, the communication interface circuit 10 performs various settings on the sound source reproduction circuit 100.

In the present embodiment, the sound source signals DI1 and DI2 input to the sound source reproduction circuit 100 are pulse code modulated signals. When the sound source data 21-1 to 21-n are compressed audio data or adaptively difference pulse code modulated audio data, the sound source data 21-i and 21-j to be reproduced are converted respectively into the sound source signals DI1 and DI2, which are the pulse code modulated signals, by a decoder (not illustrated).

The sound source reproduction circuit 100 converts the sound source signal DI1 into amplified signals DOXP and DOXN, which are sound signals, and outputs the amplified signals DOXP and DOXN to the sound reproduction device 3. As a result, the sounds corresponding to the amplified signals DOXP and DOXN are output from the sound reproduction device 3. The sound source reproduction circuit 100 converts the sound source signal DI2 into amplified signals DOXPa and DOXNa, which are sound signals, and outputs the amplified signals DOXPa and DOXNa to the sound reproduction device 3a. As a result, the sound corresponding to the amplified signals DOXPa and DOXNa is output from the sound reproduction device 3a. For example, the sound reproduction devices 3 and 3a may be speakers or buzzers. The sound output from each of the sound reproduction devices 3 and 3a may be, for example, an audio imitating a voice when a human speaks, or various sounds such as a mechanical warning sound or an effect sound.

As illustrated in FIG. 1, in the present embodiment, the sound source reproduction circuit 100 includes a modulation circuit 30, the switches 41 and 42, and an amplification circuit 50.

The modulation circuit 30 receives the sound source signal DI1, modulates a signal based on the sound source signal DI1, and outputs modulated signals DOP and DON. The signal based on the sound source signal DI1 may be the sound source signal DI1 itself or may be a signal obtained by performing some processing on the sound source signal DI1. In the present embodiment, the modulation circuit 30 includes a digital filter 31, a sigma-delta modulation circuit 32, and a pulse width modulation circuit 33.

The digital filter 31 is a low-pass filter that receives the sound source signal DI1 and outputs a signal DF in which a high-frequency noise included in the sound source signal DI1 is reduced. The sigma-delta modulation circuit 32 receives the signal DF from the digital filter 31, and performs sigma-delta modulation by oversampling the signal DF at an n-fold sampling ratio, to output a sigma-delta modulated signal DS in which noise is biased to a high-frequency band. n is an integer of 2 or more. Therefore, when a sampling frequency of the sound source signal DI1 is fs, a sampling frequency of the signal DF output from the digital filter 31 is fs, and a sampling frequency of the sigma-delta modulated signal DS is n×fs. The digital filter 31 functions as an anti-aliasing filter that reduces the high-frequency noise aliased to a signal band via the oversampling of the sigma-delta modulation circuit 32.

The pulse width modulation circuit 33 performs pulse width modulation on the sigma-delta modulated signal DS to output the modulated signals DOP and DON. Each of the modulated signals DOP and DON is a digital signal of 1 bit. When the sampling frequency of the sigma-delta modulated signal DS is n×fs, the sampling frequency of the modulated signals DOP and DON is n×m×fs. Here, when the number of bits of the sigma-delta modulated signal DS is M, $m=2^M$.

As described above, the modulation circuit 30 performs sigma-delta modulation on a signal obtained by performing digital filter processing on the sound source signal DI1, and further performs the pulse width modulation to output the modulated signals DOP and DON.

Figure 2:
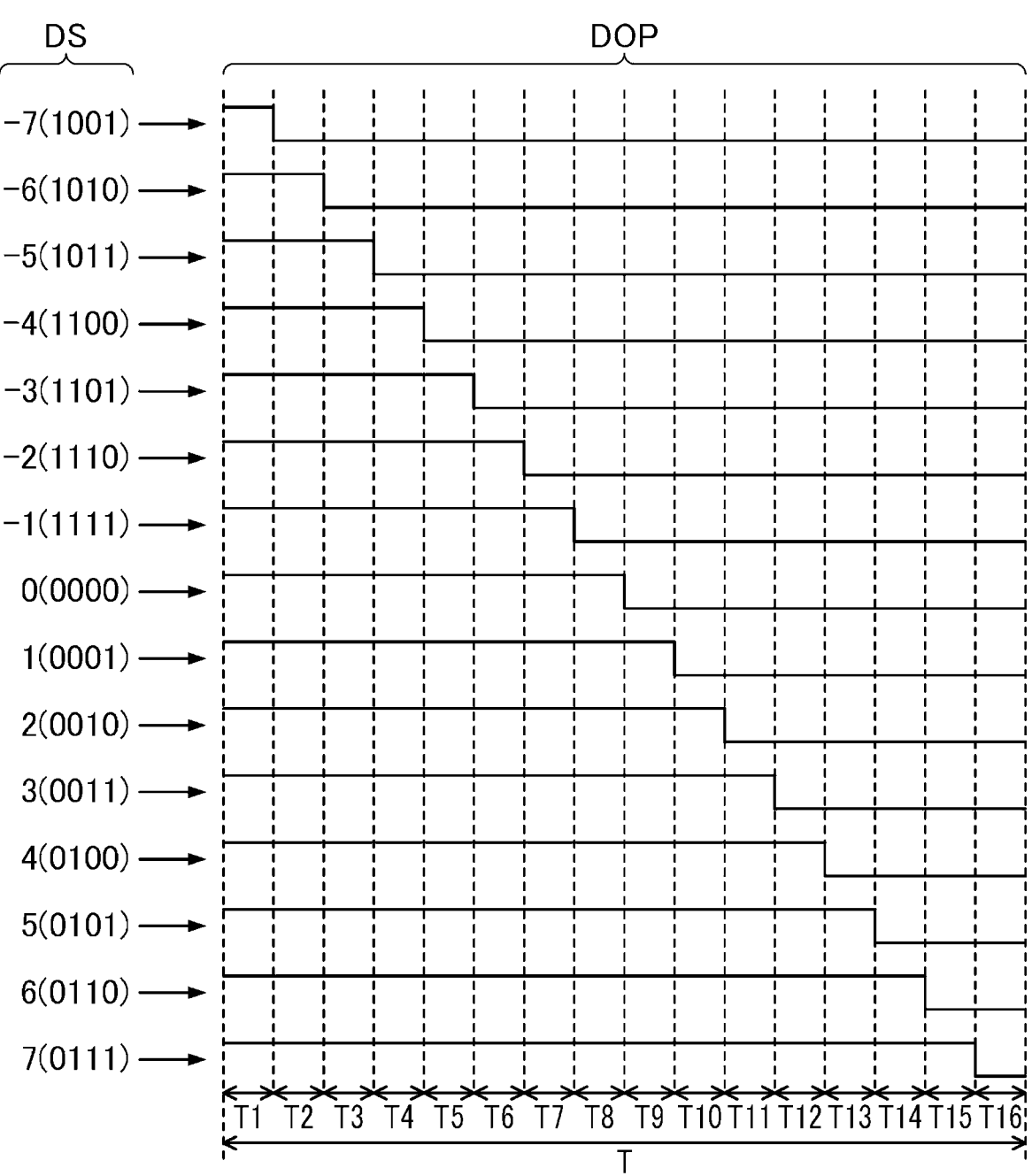
FIG. 2 is a diagram illustrating an example of pulse width modulation for generating a modulated signal.
Figure 3:
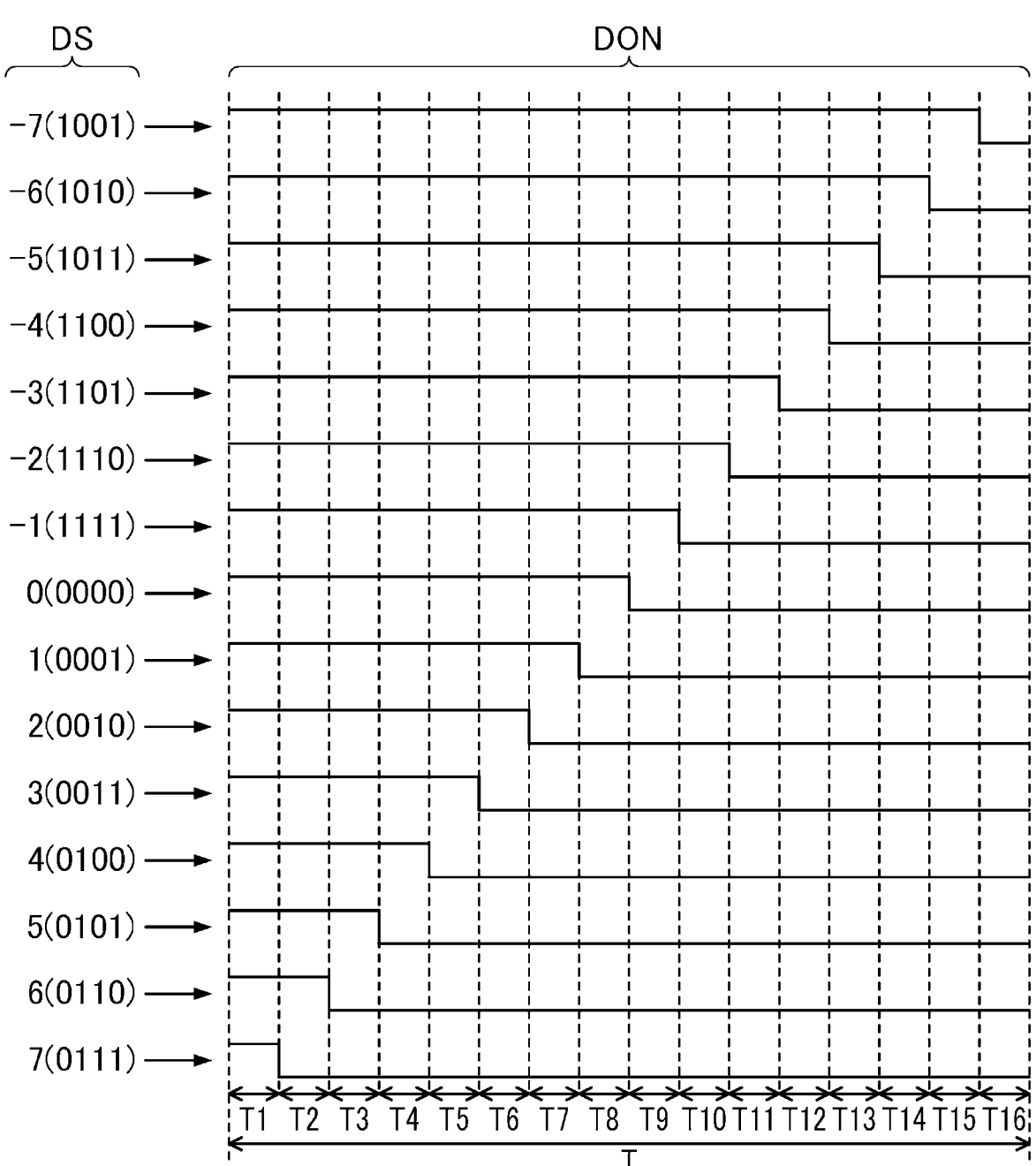
FIG. 3 is a diagram illustrating an example of pulse width modulation for generating a modulated signal.

The pulse width modulation for generating the modulated signal DOP and the pulse width modulation for generating the modulated signal DON are performed with different methods. FIG. 2 is a diagram illustrating an example of the pulse width modulation for generating the modulated signal DOP. FIG. 3 is a diagram illustrating an example of the pulse width modulation for generating the modulated signal DON. FIGS. 2 and 3 are examples when the number of bits M of the sigma-delta modulated signal DS is four. In FIGS. 2 and 3, the sigma-delta modulated signal DS is updated with a period T as a cycle, and the modulated signals DOP and DON are at a high level or a low level in each of 16 sections T1 to T16 obtained by dividing the period T. That is, a length of the period T is 1/(n×fs), and a length of each of the sections T1 to T16 is 1/(n×m×fs).

As illustrated in FIG. 2, a high-level time of the modulated signal DOP is longer as a value of the sigma-delta modulated signal DS is larger. For example, when the sigma-delta modulated signal DS is "−7" in decimal, that is, "1001" in binary, the modulated signal DOP is at a high level in the one section T1 and is at a low level in the 15 sections T2 to T16. For example, when the sigma-delta modulated signal DS is "0" in decimal, that is, "0000" in binary, the modulated signal DOP is at a high level in the eight sections T1 to T8 and is at a low level in the eight sections T9 to T16. For example, when the sigma-delta modulated signal DS is "7" in decimal, that is, "0111" in binary, the modulated signal DOP is at a high level in the 15 sections T1 to T15 and is at a low level in the one section T16.

As illustrated in FIG. 3, a high-level time of the modulated signal DON is shorter as the value of the sigma-delta modulated signal DS is larger. For example, when the sigma-delta modulated signal DS is "−7" in decimal, that is, "1001" in binary, the modulated signal DON is at a high level in the 15 sections T1 to T15 and is at a low level in the one section T16. For example, when the sigma-delta modulated signal DS is "0" in decimal, that is, "0000" in binary, the modulated signal DON is at a high level in the eight sections T1 to T8 and is at a low level in the eight sections T9 to T16. For example, when the sigma-delta modulated signal DS is "7" in decimal, that is, "0111" in binary, the modulated signal DON is at a high level in the one section T1 and is at a low level in the 15 sections T2 to T16.

Figure 4:
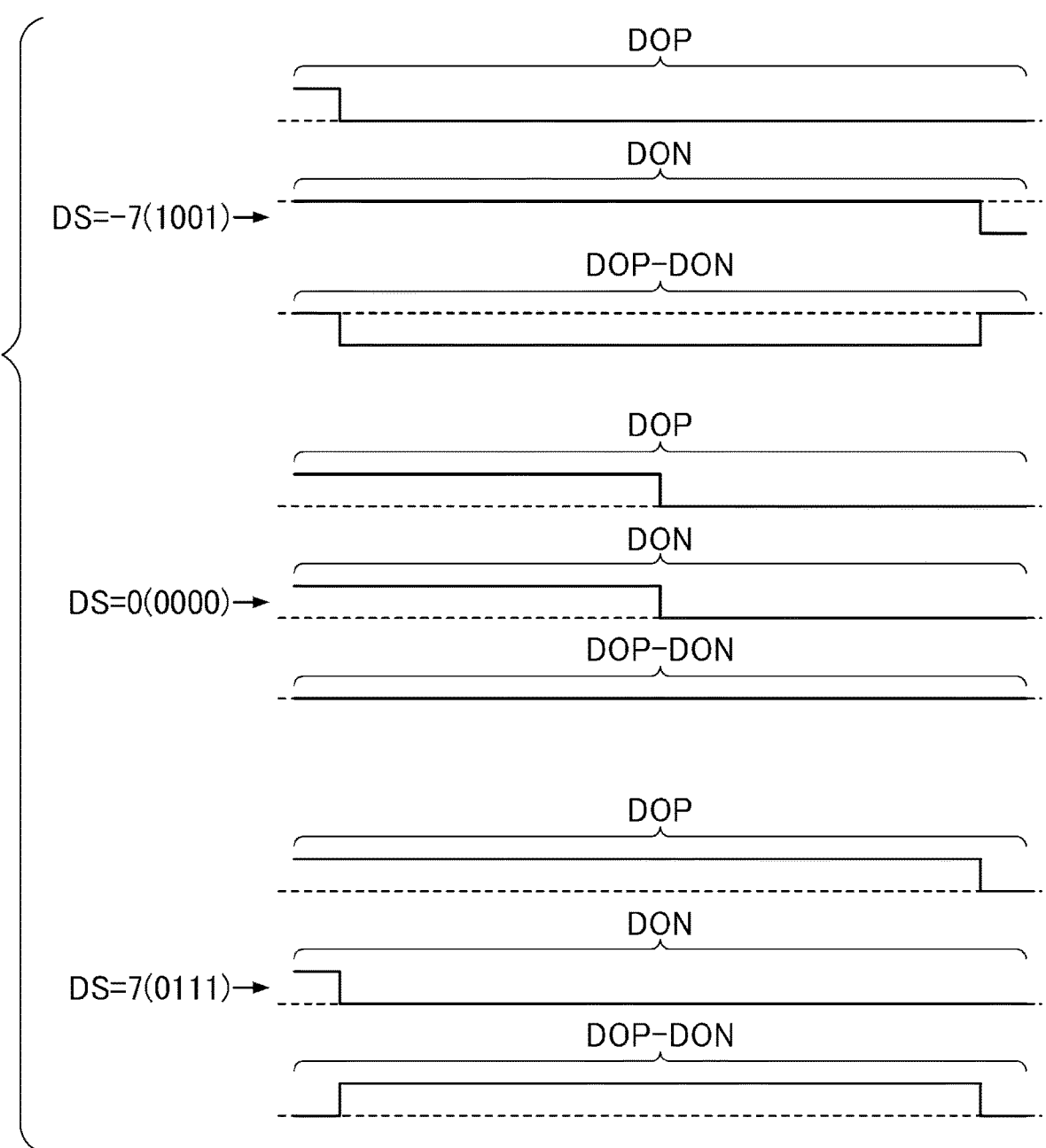
FIG. 4 is a diagram illustrating an example of a difference between the modulated signal and the modulated signal.

Therefore, for example, a difference between the modulated signal DOP and the modulated signal DON when the sigma-delta modulated signal DS is "−7", "0", and "7" in decimal is as illustrated in FIG. 4.

Returning to the description of FIG. 1, the switch 41 outputs any one of the modulated signal DOP and a modulated signal TP to a class-D amplifier 51P of the amplification circuit 50 in response to the control signal output from the communication interface circuit 10. Specifically, the switch 41 outputs the modulated signal DOP to the class-D amplifier 51P when the operation mode of the semiconductor device 1 is the normal operation mode, and outputs the modulated signal TP to the class-D amplifier 51P when the operation mode of the semiconductor device 1 is the inspection mode.

Further, the switch 42 outputs any one of the modulated signal DON and a modulated signal TN to a class-D amplifier 51N of the amplification circuit 50 in response to the control signal output from the communication interface circuit 10. Specifically, the switch 42 outputs the modulated signal DON to the class-D amplifier 51N when the operation mode of the semiconductor device 1 is the normal operation mode, and outputs the modulated signal TN to the class-D amplifier 51N when the operation mode of the semiconductor device 1 is the inspection mode.

In the normal operation mode, the amplification circuit 50 receives the modulated signals DOP and DON, and outputs amplified signals DOXP and DOXN obtained by amplifying the modulated signals DOP and DON to output terminals 91 and 92 of the semiconductor device 1. In the inspection mode, the amplification circuit 50 receives the modulated signals TP and TN, and outputs the amplified signals DOXP and DOXN obtained by amplifying the modulated signals TP and TN to the output terminals 91 and 92 of the semiconductor device 1.

In the present embodiment, the amplification circuit 50 includes the two class-D amplifiers 51P and 51N. The class-D amplifier 51P outputs the amplified signal DOXP obtained by amplifying the modulated signal DOP to the output terminal 91 in the normal operation mode, and outputs the amplified signal DOXP obtained by amplifying the modulated signal TP to the output terminal 91 in the inspection mode. The class-D amplifier 51N outputs the amplified signal DOXN obtained by amplifying the modulated signal DON to the output terminal 92 in the normal operation mode, and outputs the amplified signal DOXN obtained by amplifying the modulated signal TN to the output terminal 92 in the inspection mode. The output terminal 91 is coupled to a terminal P1 of the sound reproduction device 3, and the output terminal 92 is coupled to a terminal P2 of the sound reproduction device 3. The sound reproduction device 3 reproduces a sound having a magnitude corresponding to a voltage difference between the amplified signal DOXP and the amplified signal DOXN. It is preferable that the sound reproduction device 3 outputs a desired sound indicated by the sound source reproduction command in the normal operation mode, and outputs a very small sound that is difficult to be heard by a human ear in the inspection mode. That is, it is preferable that a volume of the sound reproduced by the sound reproduction device 3 in the inspection mode is smaller than a minimum value of a volume of the sound reproduced by the sound reproduction device 3 in the normal operation mode. In other words, it is preferable that a voltage difference between the amplified signal DOXP and the amplified signal DOXN in the inspection mode is smaller than a voltage difference between the amplified signal DOXP and the amplified signal DOXN when the minimum sound is output from the sound reproduction device 3 in the normal operation mode. As a result, it can be made less noticeable to a user that the semiconductor device 1 is operating in the inspection mode.

As illustrated in FIG. 1, the sound source reproduction circuit 100 further includes a modulation circuit 30a, switches 41a and 42a, and an amplification circuit 50a.

The modulation circuit 30a receives the sound source signal DI2, modulates a signal based on the sound source signal DI2, and outputs modulated signals DOPa and DONa. The signal based on the sound source signal DI2 may be the sound source signal DI2 itself or may be a signal obtained by performing some processing on the sound source signal DI2. In the present embodiment, the modulation circuit 30a includes a digital filter 31a, a sigma-delta modulation circuit 32a, and a pulse width modulation circuit 33a.

The digital filter 31a is a low-pass filter that receives the sound source signal DI2 and outputs a signal DFa in which a high-frequency noise included in the sound source signal DI2 is reduced. The sigma-delta modulation circuit 32a receives the signal DFa from the digital filter 31a, and performs sigma-delta modulation by oversampling the signal DFa at an n-fold sampling ratio, to output a sigma-delta modulated signal DSa in which noise is biased to a high-frequency band. n is an integer of 2 or more. Therefore, when a sampling frequency of the sound source signal DI2 is fs, a sampling frequency of the signal DFa output from the digital filter 31a is fs, and a sampling frequency of the sigma-delta modulated signal DSa is n×fs. The digital filter 31a functions as an anti-aliasing filter that reduces the high-frequency noise aliased to a signal band via the over-sampling of the sigma-delta modulation circuit 32a.

The pulse width modulation circuit 33a performs pulse width modulation on the sigma-delta modulated signal DSa to output the modulated signals DOPa and DONa. Each of the modulated signals DOPa and DONa is a digital signal of 1 bit. When the sampling frequency of the sigma-delta modulated signal DSa is n×fs, the sampling frequency of the modulated signals DOPa and DONa is n×m×fs. Here, when the number of bits of the sigma-delta modulated signal DSa is M, $m=2^M$.

As described above, the modulation circuit 30a performs sigma-delta modulation on a signal obtained by performing digital filter processing on the sound source signal DI2, and further performs the pulse width modulation to output the modulated signals DOPa and DONa.

The method of pulse width modulation for generating the modulated signals DOPa and DONa is the same as the method of pulse width modulation for generating the modulated signals DOP and DON illustrated in FIGS. 2 to 4, and thus the description thereof will be omitted.

The switch 41a outputs any one of the modulated signal DOPa and a modulated signal TP to a class-D amplifier 51Pa of the amplification circuit 50a in response to the control signal output from the communication interface circuit 10. Specifically, the switch 41a outputs the modulated signal DOPa to the class-D amplifier 51Pa when the operation mode of the semiconductor device 1 is the normal operation mode, and outputs the modulated signal TP to the class-D amplifier 51Pa when the operation mode of the semiconductor device 1 is the inspection mode.

Further, the switch 42a outputs any one of the modulated signal DONa and a modulated signal TN to a class-D amplifier 51Na of the amplification circuit 50a in response to the control signal output from the communication interface circuit 10. Specifically, the switch 42a outputs the modulated signal DONa to the class-D amplifier 51Na when the operation mode of the semiconductor device 1 is the normal operation mode, and outputs the modulated signal TN to the class-D amplifier 51Na when the operation mode of the semiconductor device 1 is the inspection mode.

In the normal operation mode, the amplification circuit 50a receives the modulated signals DOPa and DONa, and outputs amplified signals DOXPa and DOXNa obtained by amplifying the modulated signals DOPa and DONa to output terminals 93 and 94 of the semiconductor device 1. In the inspection mode, the amplification circuit 50a receives the modulated signals TP and TN, and outputs the amplified signals DOXPa and DOXNa obtained by amplifying the modulated signals TP and TN to the output terminals 93 and 94 of the semiconductor device 1.

In the present embodiment, the amplification circuit 50a includes the two class-D amplifiers 51Pa and 51Na. The class-D amplifier 51Pa outputs the amplified signal DOXPa obtained by amplifying the modulated signal DOPa to the output terminal 93 in the normal operation mode, and outputs the amplified signal DOXPa obtained by amplifying the modulated signal TP to the output terminal 93 in the inspection mode. The class-D amplifier 51Na outputs the amplified signal DOXNa obtained by amplifying the modulated signal DONa to the output terminal 94 in the normal operation mode, and outputs the amplified signal DOXNa obtained by amplifying the modulated signal TN to the output terminal 94 in the inspection mode. The output terminal 93 is coupled to a terminal P1a of the sound reproduction device 3a, and the output terminal 94 is coupled to a terminal P2a of the sound reproduction device 3a. The sound reproduction device 3a reproduces a sound having a magnitude corresponding to a voltage difference between the amplified signal DOXPa and the amplified signal DOXNa. It is preferable that the sound reproduction device 3a outputs a desired sound indicated by the sound source reproduction command in the normal operation mode, and outputs a very small sound that is difficult to be heard by a human ear in the inspection mode. That is, it is preferable that a volume of the sound reproduced by the sound reproduction device 3a in the inspection mode is smaller than a minimum value of a volume of the sound reproduced by the sound reproduction device 3a in the normal operation mode. In other words, it is preferable that a voltage difference between the amplified signal DOXPa and the amplified signal DOXNa in the inspection mode is smaller than a voltage difference between the amplified signal DOXPa and the amplified signal DOXNa when the minimum sound is output from the sound reproduction device 3a in the normal operation mode. As a result, it can be made less noticeable to a user that the semiconductor device 1 is operating in the inspection mode.

The inspection circuit 110 is a circuit that inspects the sound reproduction device 3.

Figure 5:
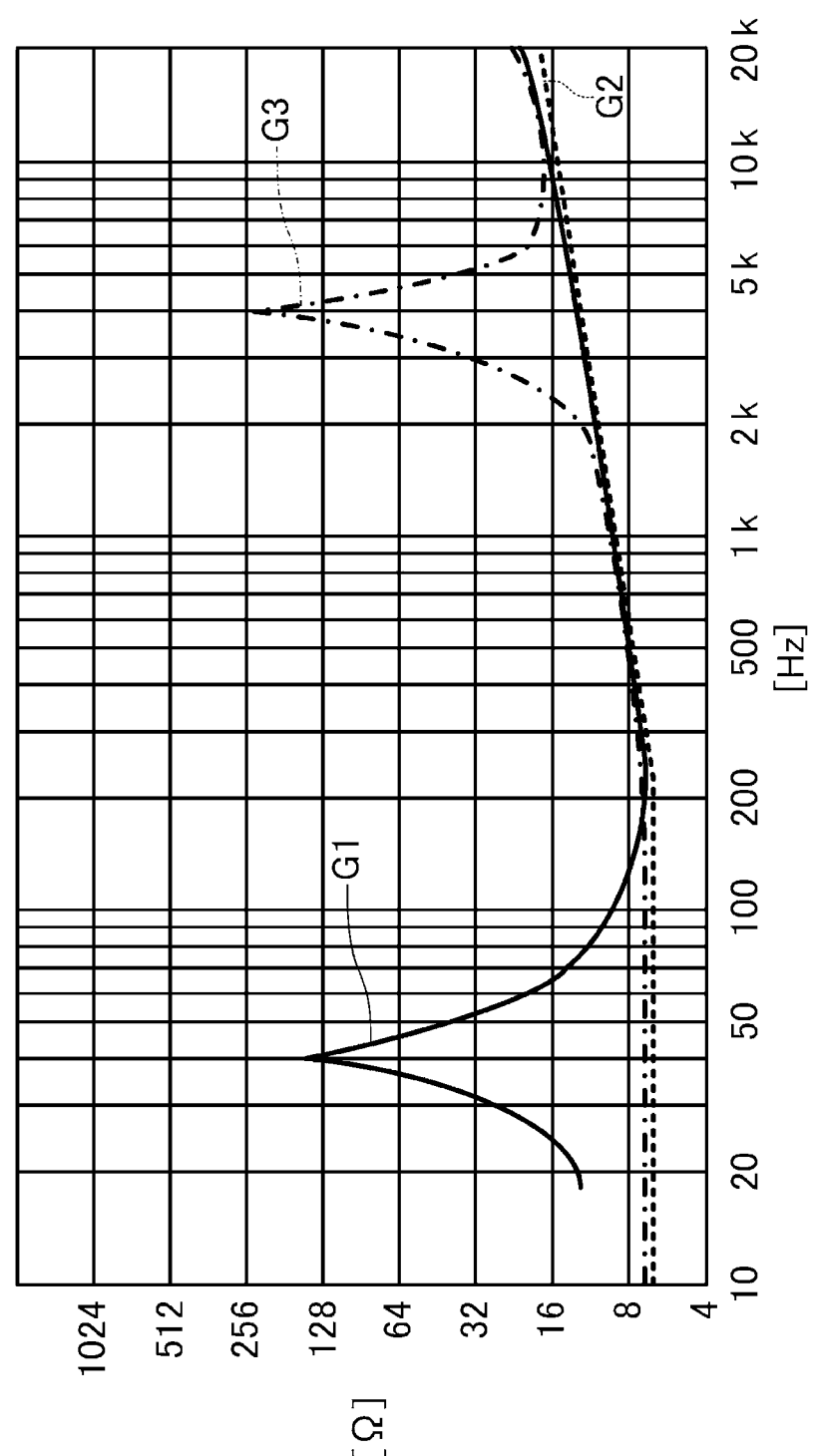
FIG. 5 is a diagram illustrating an example of a relationship between a state of a speaker and an impedance characteristic thereof.

FIG. 5 is a diagram illustrating an example of a relationship between a state of the speaker, which is an example of the sound reproduction devices 3 and 3a, and an impedance characteristic thereof. In FIG. 5, a horizontal axis is a frequency of an input signal of the speaker, and a vertical axis is an impedance value of the speaker. G1 is an example of an impedance characteristic when the speaker is normal. A peak frequency, which is a frequency of the input signal at which an impedance of the speaker reaches a peak, varies depending on the type of the speaker, but the peak frequency is included in at least a frequency band of 20 Hz or higher, which is a lower limit of an audible range of a human, and 3 kHz or lower, which is a frequency used for a buzzer warning sound, when the speaker is normal. G2 is an example of an impedance characteristic in a state where a magnet of the speaker is damaged and removed. When the magnet of the speaker is removed, only a coil remains, so that the impedance value slowly increases as the frequency is higher, and the peak frequency disappears. G3 is an example of an impedance characteristic in a state where a cone paper of the speaker is torn. When the cone paper, which is a vibration surface of the speaker, is torn, a low-tone sound is not emitted, and the peak frequency is shifted to the high frequency side.

As described above, the peak frequency changes depending on the state of the speaker. Therefore, in the present embodiment, in the inspection mode, the inspection circuit 110 detects peak frequencies $f1_{peak}$ and $f2_{peak}$ for the sound reproduction devices 3 and 3$a$, respectively, and determines the states of the sound reproduction devices 3 and 3$a$ based on the detected peak frequencies $f1_{peak}$ and $f2_{peak}$. For example, when the sound reproduction devices 3 and 3$a$ are the same type of speaker, the peak frequencies $f1_{peak}$ and $f2_{peak}$ substantially match when the sound reproduction devices 3 and 3$a$ are normal, but a difference between the peak frequencies $f1_{peak}$ and $f2_{peak}$ is large and the peak frequencies $f1_{peak}$ and $f2_{peak}$ do not match when any one of the sound reproduction devices 3 and 3$a$ fails, so that the inspection circuit 110 can determine the states of the sound reproduction devices 3 and 3$a$.

In the present embodiment, the inspection circuit 110 includes a test signal generation circuit 60, a determination circuit 61, a memory 62, and a peak frequency detection circuits 70 and 70$a$. The test signal generation circuit 60, the determination circuit 61, and the peak frequency detection circuits 70 and 70$a$ operate in the inspection mode, and stop the operation in the normal operation mode.

The test signal generation circuit 60 modulates a test signal of which a frequency is changed in a frequency band set in advance, to generate the modulated signals TP and TN. The frequency band in which the test signal generation circuit 60 changes the frequency of the test signal can be set to any frequency band by the micro control unit 2, and may be, for example, a frequency band of 10 Hz or higher and 3 kHz or lower. In the present embodiment, the test signal generation circuit 60 performs the pulse width modulation on the test signal to generate the modulated signals TP and TN. The pulse width modulation method via the test signal generation circuit 60 is the same as the pulse width modulation method via the pulse width modulation circuits 33 and 33$a$.

The peak frequency detection circuit 70 measures a potential difference between the output terminal 91 and the output terminal 92, and detects the peak frequency $f1_{peak}$ which is a frequency of the test signal at which the impedance of the sound reproduction device 3 reaches a peak. The peak frequency detection circuit 70 further detects a peak voltage $v1_{peak}$, which is a voltage obtained by amplifying the potential difference between the output terminal 91 and the output terminal 92 when the frequency of the test signal is the peak frequency. As will be described below, the peak frequency $f1_{peak}$ or the peak voltage $v1_{peak}$ changes depending on the temperature of the sound reproduction device 3.

The peak frequency detection circuit 70$a$ measures a potential difference between the output terminal 93 and the output terminal 94, and detects the peak frequency $f2_{peak}$ which is a frequency of the test signal at which the impedance of the sound reproduction device 3$a$ reaches a peak. The peak frequency detection circuit 70$a$ further detects a peak voltage $v2_{peak}$, which is a voltage obtained by amplifying the potential difference between the output terminal 93 and the output terminal 94 when the frequency of the test signal is the peak frequency. As will be described below, the peak frequency $f2_{peak}$ or the peak voltage $v2_{peak}$ changes depending on the temperature of the sound reproduction device 3$a$.

The determination circuit 61 determines whether or not the difference between the peak frequency $f1_{peak}$ detected by the peak frequency detection circuit 70 and the peak frequency $f2_{peak}$ detected by the peak frequency detection circuit 70$a$ is included in a predetermined reference frequency difference range. The reference frequency difference range is a range of a frequency determined based on a difference in the peak frequencies between the sound reproduction devices 3 and 3$a$, the temperature characteristics of the peak frequency, or the like. The determination circuit 61 further determines whether or not a difference between the peak voltage $v1_{peak}$ detected by the peak frequency detection circuit 70 and the peak voltage $v2_{peak}$ detected by the peak frequency detection circuit 70$a$ is included in a predetermined reference voltage difference range. The reference voltage difference range is a range of a voltage determined based on a difference in the peak impedance of the sound reproduction devices 3 and 3$a$, the temperature characteristics of the peak impedance, or the like. Further, in the present embodiment, the determination circuit 61 determines the states of the sound reproduction devices 3 and 3$a$, such as the presence or absence of the failures of the sound reproduction devices 3 and 3$a$, based on the determination result of whether or not the difference between the peak frequency $f1_{peak}$ and the peak frequency $f2_{peak}$ is included in the reference frequency difference range or the determination result of whether or not the difference between the peak voltage $v1_{peak}$ and the peak voltage $v2_{peak}$ is included in the reference voltage difference range. The details of the processing of the determination circuit 61 will be described below.

The memory 62 includes a non-volatile memory (not illustrated), and the non-volatile memory stores constants $\alpha$ and $\beta$. The constant $\alpha$ is a constant for determining the reference frequency difference range in consideration of the characteristic variation or the temperature difference of the sound reproduction devices 3 and 3$a$, and the constant $\beta$ is a constant for determining the reference voltage difference range in consideration of the characteristic variation and the temperature difference of the sound reproduction devices 3 and 3$a$. The memory 62 includes a volatile memory (not illustrated) that stores various temporarily created data.

The switch 81 switches whether to electrically couple or cut off between the output terminal 91 of the semiconductor device 1 and the peak frequency detection circuit 70 in response to the control signal output from the communication interface circuit 10. Specifically, the switch 81 electrically cuts off the output terminal 91 and the peak frequency detection circuit 70 when the operation mode of the semiconductor device 1 is the normal operation mode, and electrically couples the output terminal 91 and the peak frequency detection circuit 70 when the operation mode of the semiconductor device 1 is the inspection mode.

Similarly, the switch 82 switches whether to electrically couple or cut off between the output terminal 92 of the semiconductor device 1 and the peak frequency detection circuit 70 in response to the control signal output from the communication interface circuit 10. Specifically, the switch 82 electrically cuts off the output terminal 92 and the peak frequency detection circuit 70 when the operation mode of the semiconductor device 1 is the normal operation mode, and electrically couples the output terminal 92 and the peak frequency detection circuit 70 when the operation mode of the semiconductor device 1 is the inspection mode.

As described above, the peak frequency detection circuit 70 is electrically cut off from the output terminals 91 and 92 in the normal operation mode by the switches 81 and 82, and is electrically coupled to the output terminals 91 and 92 in the inspection mode to measure the potential difference between the output terminal 91 and the output terminal 92 and detect the peak frequency $f1_{peak}$ and the peak voltage $v1_{peak}$.

The switch 81$a$ switches whether to electrically couple or cut off the output terminal 93 of the semiconductor device 1 and the peak frequency detection circuit 70$a$ in response to the control signal output from the communication interface circuit 10. Specifically, the switch 81$a$ electrically cuts off the output terminal 93 and the peak frequency detection circuit 70$a$ when the operation mode of the semiconductor device 1 is the normal operation mode, and electrically couples the output terminal 93 and the peak frequency detection circuit 70$a$ when the operation mode of the semiconductor device 1 is the inspection mode.

Similarly, the switch 82$a$ switches whether to electrically couple or cut off the output terminal 94 of the semiconductor device 1 and the peak frequency detection circuit 70$a$ in response to the control signal output from the communication interface circuit 10. Specifically, the switch 82$a$ electrically cuts off the output terminal 94 and the peak frequency detection circuit 70$a$ when the operation mode of the semiconductor device 1 is the normal operation mode, and electrically couples the output terminal 94 and the peak frequency detection circuit 70$a$ when the operation mode of the semiconductor device 1 is the inspection mode.

As described above, the peak frequency detection circuit 70$a$ is electrically cut off from the output terminals 93 and 94 in the normal operation mode by the switches 81$a$ and 82$a$, and is electrically coupled to the output terminals 93 and 94 in the inspection mode to measure the potential difference between the output terminal 93 and the output terminal 94 and detect the peak frequency $f2_{peak}$ and the peak voltage $v2_{peak}$.

When a command to read the information on the determination result of the determination circuit 61 is received from the micro control unit 2, the communication interface circuit 10 acquires information on the determination result from the determination circuit 61 and transmits the information to the micro control unit 2. The micro control unit 2 can recognize the states of the sound reproduction devices 3 and 3$a$ and perform various types of processing corresponding to the states of the sound reproduction devices 3 and 3$a$ based on the information on the determination result.

1-1-2. State Determination of Sound Reproduction Device

Figure 6:
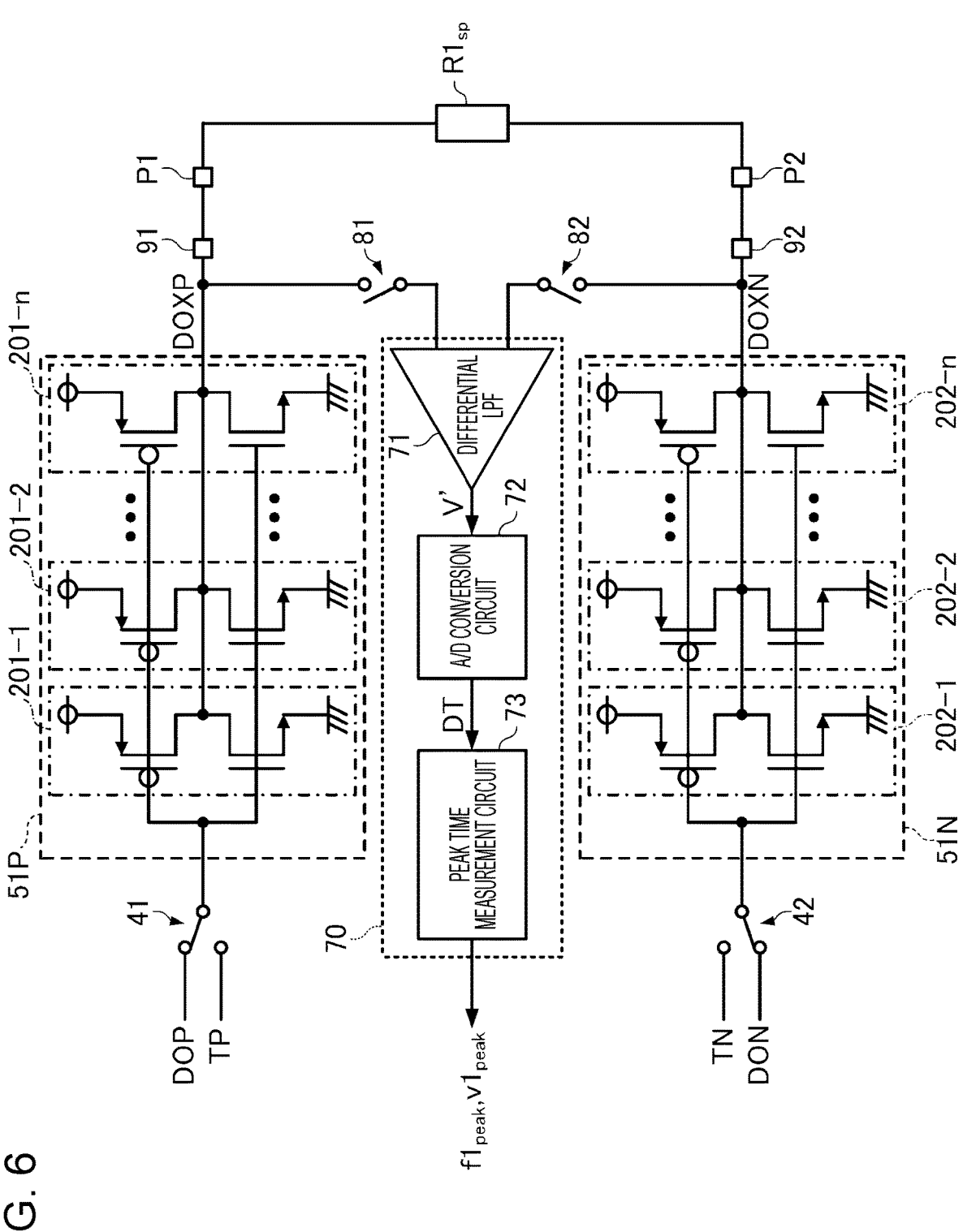
FIG. 6 is a diagram illustrating a configuration example of a class-D amplifier, a peak frequency detection circuit, and peripheral circuits thereof.
Figure 7:
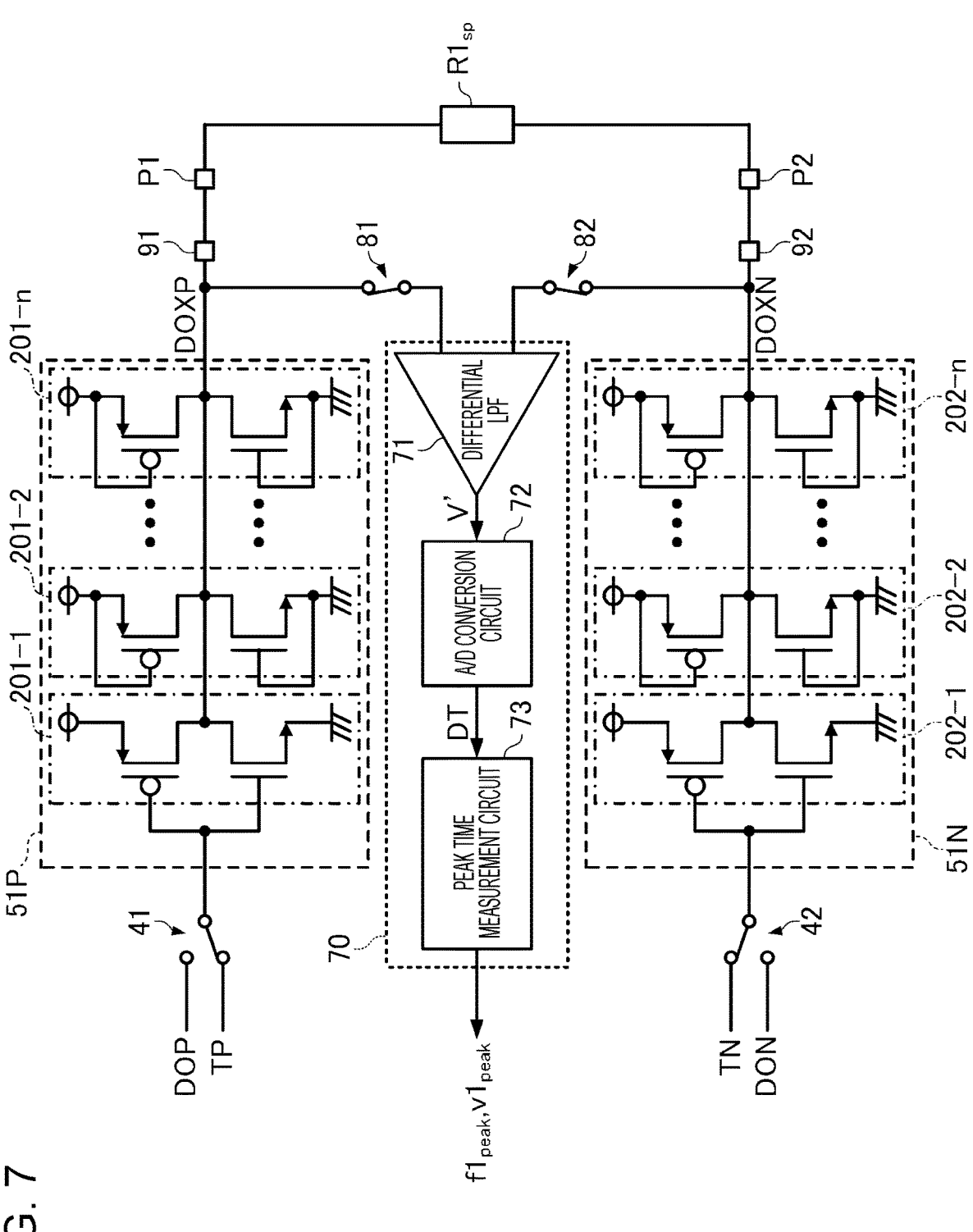
FIG. 7 is a diagram illustrating a configuration example of the class-D amplifier, the peak frequency detection circuit, and the peripheral circuits thereof.

FIGS. 6 and 7 are diagrams illustrating a configuration example of the class-D amplifiers 51P and 51N, the peak frequency detection circuit 70, and peripheral circuits thereof. FIG. 6 illustrates a configuration in the normal operation mode, and FIG. 7 illustrates a configuration in the inspection mode.

As illustrated in FIGS. 6 and 7, the class-D amplifier 51P includes a plurality of inverter circuits 201-1 to 201-$n$, and the class-D amplifier 51N includes a plurality of inverter circuits 202-1 to 202-$n$. n is an integer of 2 or more, and may be, for example, about 10 to 100. Each of the inverter circuits 201-1 to 201-$n$ is configured by a pair of a PMOS transistor and an NMOS transistor, and an output terminal which is a node to which a drain of the PMOS transistor and a drain of the NMOS transistor are coupled is coupled to the output terminal 91. Similarly, each of the inverter circuits 202-1 to 202-$n$ is configured by a pair of a PMOS transistor and an NMOS transistor, and an output terminal which is a node to which a drain of the PMOS transistor and a drain of the NMOS transistor are coupled is coupled to the output terminal 92.

As illustrated in FIG. 6, in the normal operation mode, the modulated signal DOP is input to the input terminal of each of the inverter circuits 201-1 to 201-$n$ included in the class-D amplifier 51P via the switch 41, and the modulated signal DON is input to the input terminal of each of the inverter circuits 202-1 to 202-$n$ included in the class-D amplifier 51N via the switch 42. That is, in the normal operation mode, the inverter circuits 201-1 to 201-$n$ included in the class-D amplifier 51P are coupled parallel between the modulation circuit 30 and the output terminal 91 of the semiconductor device 1, and the inverter circuits 202-1 to 202-$n$ included in the class-D amplifier 51N are coupled parallel between the modulation circuit 30 and the output terminal 92 of the semiconductor device 1.

Accordingly, an on-resistance $R1_{onP}$ of the class-D amplifier 51P is 1/n of an on-resistance of the inverter circuit 201-1, and an on-resistance $R1_{onN}$ of the class-D amplifier 51N is 1/n of an on-resistance of the inverter circuit 202-1.

Then, the amplification circuit 50 outputs the amplified signal DOXP obtained by amplifying the modulated signal DOP to the output terminal 91, and outputs the amplified signal DOXN obtained by amplifying the modulated signal DON to the output terminal 92. The output terminals 91 and 92 are coupled to the terminals P1 and P2 of the sound reproduction device 3, respectively. An impedance $R1_{sp}$ between the terminal P1 and the terminal P2 is, for example, $4\Omega$ to $128\Omega$, and in the normal operation mode, the on-resistance $R1_{onP}$ of the class-D amplifier 51P and the on-resistance $R1_{onN}$ of the class-D amplifier 51N are about $\frac{1}{10}$ to $\frac{1}{100}$ of the impedance $R1_{sp}$ of the sound reproduction device 3.

As illustrated in FIG. 6, in the normal operation mode, the switches 81 and 82 are non-conductive, and the peak frequency detection circuit 70 is electrically cut off from the output terminals 91 and 92 of the semiconductor device 1.

On the other hand, as illustrated in FIG. 7, in the inspection mode, the modulated signal TP is input to each input terminal of some inverter circuits among the inverter circuits 201-1 to 201-$n$ of the class-D amplifier 51P via the switch 41, and each output terminal of some other inverter circuits among the inverter circuits 201-1 to 201-$n$ has a high impedance. For example, in the inspection mode, the modulated signal TP is input to the input terminal of the inverter circuit 201-1, and the output terminal of each of the inverter circuits 201-2 to 201-$n$ has a high impedance. Similarly, the modulated signal TN is input to each input terminal of some inverter circuits among the inverter circuits 202-1 to 202-$n$ of the class-D amplifier 51N via the switch 42, and each output terminal of some other inverter circuits among the inverter circuits 202-1 to 202-$n$ has a high impedance. For example, in the inspection mode, the modulated signal TN is input to the input terminal of the inverter circuit 202-1, and the output terminal of each of the inverter circuits 202-2 to 202-$n$ has a high impedance. As a result, for example, the on-resistance $R1_{onP}$ of the class-D amplifier 51P and the on-resistance $R1_{onN}$ of the class-D amplifier 51N are substantially the same as the impedance $R1_{sp}$.

As illustrated in FIG. 7, in the inspection mode, the switches 81 and 82 are conductive, and the peak frequency detection circuit 70 is electrically coupled to the output terminals 91 and 92 of the semiconductor device 1.

The peak frequency detection circuit 70 includes a differential low-pass filter 71, an A/D conversion circuit 72, and a peak time measurement circuit 73.

In the inspection mode, a voltage of the output terminal 91 and a voltage of the output terminal 92 are input to the differential low-pass filter 71 via the switches 81 and 82. That is, the differential low-pass filter 71 receives the amplified signals DOXP and DOXN, reduces a high-frequency noise component superimposed on the amplified signals DOXP and DOXN via the pulse width modulation, and outputs a voltage V' corresponding to the potential difference of the amplified signals DOXP and DOXN. A cutoff frequency of the differential low-pass filter 71 is higher than a maximum frequency of the frequency band in which the test signal generation circuit 60 changes the frequency of the test signal. For example, when the test signal generation circuit 60 changes the frequency of the test signal in the frequency band of 10 Hz or higher and 3 kHz or lower, the cutoff frequency of the differential low-pass filter 71 is higher than 3 kHz. Since the cutoff frequency of the differential low-pass filter 71 is higher than the maximum frequency of the frequency band in which the frequency of the test signal is changed, a frequency component included in the frequency band is not attenuated by the differential low-pass filter 71.

Figure 8:
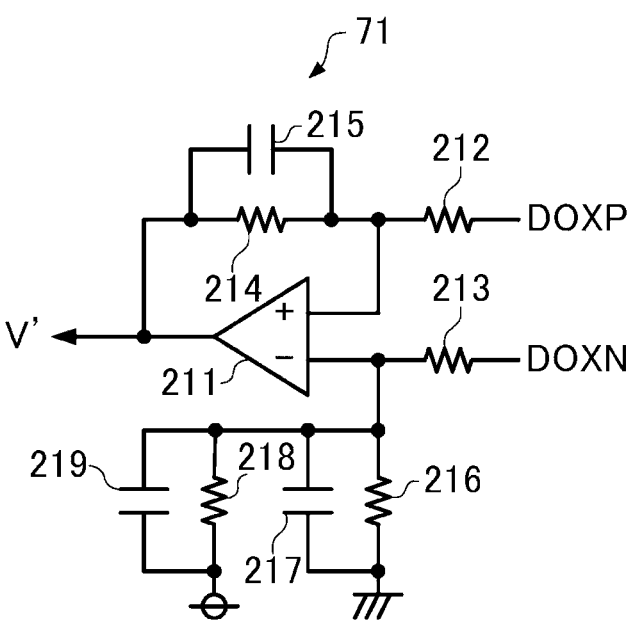
FIG. 8 is a diagram illustrating a configuration example of a differential low-pass filter.

FIG. 8 is a diagram illustrating a configuration example of the differential low-pass filter 71. As illustrated in FIG. 8, the differential low-pass filter 71 includes an operational amplifier 211, five resistors 212, 213, 214, 216, and 218, and three capacitors 215, 217, and 219.

In the inspection mode, the amplified signal DOXP output to the output terminal 91 of the semiconductor device 1 is input to one end of the resistor 212. The amplified signal DOXN output to the output terminal 92 of the semiconductor device 1 is input to one end of the resistor 213. The other end of the resistor 212, one end of the resistor 214, and one end of the capacitor 215 are coupled to a non-inverting input terminal of the operational amplifier 211. The other end of the resistor 213, one end of the resistor 216, one end of the capacitor 217, one end of the resistor 218, and one end of the capacitor 219 are coupled to an inverting input terminal of the operational amplifier 211.

The other end of the resistor 214 and the other end of the capacitor 215 are coupled to an output terminal of the operational amplifier 211. The other end of the resistor 216 and the other end of the capacitor 217 are grounded, and a power supply voltage is supplied to the other end of the resistor 218 and the other end of the capacitor 219.

The differential low-pass filter 71 configured as described above reduces the high-frequency noise component superimposed on the amplified signals DOXP and DOXN via the pulse width modulation, and outputs the voltage V' corresponding to the potential difference between the amplified signals DOXP and DOXN, that is, the potential difference between the output terminal 91 and the output terminal 92 from the output terminal of the operational amplifier 211. When the power supply voltage is VDD and a ground voltage is 0 V, the voltage V' is higher than VDD×½ when the potential difference between the output terminal 91 and the output terminal 92 in which high-frequency noise components are reduced is positive, the voltage V' is lower than VDD×½ when the potential difference between the output terminal 91 and the output terminal 92 in which high-frequency noise components are reduced is negative.

An amplitude voltage V' (p-p) of the voltage V' and the impedance $R1_{sp}$ of the sound reproduction device 3, the on-resistance $R1_{onP}$ of the class-D amplifier 51P, and the on-resistance $R1_{onN}$ of the class-D amplifier 51N have a relationship of the expression (1). From the expression (1), the amplitude of the voltage V' is larger as the impedance $R1_{sp}$ is larger, and thus the amplitude of the voltage V' reaches the maximum when the impedance $R1_{sp}$ reaches a peak.

$$V'(p-p) \propto \frac{R_{sp}}{R_{sp} + R_{onP} + R_{onN}} \times VDD \qquad (1)$$

Returning to the description of FIG. 7, the A/D conversion circuit 72 converts the output voltage V' of the differential low-pass filter 71 into an m-bit digital signal, and outputs a digital signal of m-bit as data DT of m-bit. m is an integer of 2 or more. The integer m is set to an appropriate value in response to the requirements such as the detection accuracy of the peak frequency or the size of the peak frequency detection circuit 70.

The peak time measurement circuit 73 measures a peak time, which is a time when the potential difference between the output terminal 91 and the output terminal 92 reaches the maximum, based on the data DT which is the output signal of the A/D conversion circuit 72.

Specifically, the peak time measurement circuit 73 measures a time when the data DT reaches the maximum as the peak time. The peak time measurement circuit 73 measures the output voltage V' of the differential low-pass filter 71 at the peak time as the peak voltage. Specifically, the peak time measurement circuit 73 measures a maximum value of the data DT as the peak voltage.

As described above, when the impedance $R1_{sp}$ of the sound reproduction device 3 reaches the maximum and when the impedance $R1_{sp}$ of the sound reproduction device 3 reaches the peak, the amplitude of the voltage V' reaches the maximum. That is, when the impedance $R1_{sp}$ reaches the peak impedance $R1_{peak}$, the potential difference between the output terminal 91 and the output terminal 92 reaches the maximum. Since the frequency of the test signal changes sequentially at predetermined timings, the peak frequency, which is a frequency at which the impedance $R1_{sp}$ of the sound reproduction device 3 reaches the peak impedance $R1_{peak}$, is uniquely determined from the peak time measured by the peak time measurement circuit 73. As described above, in the inspection mode, the peak frequency detection circuit 70 detects the peak frequency by measuring the peak time, which is the time when the potential difference between the output terminal 91 and the output terminal 92 reaches the maximum. In the inspection mode, the peak frequency detection circuit 70 further detects a peak voltage, which is a voltage obtained by amplifying the potential difference between the output terminal 91 and the output terminal 92 when the frequency of the test signal is the peak frequency.

Figure 9:
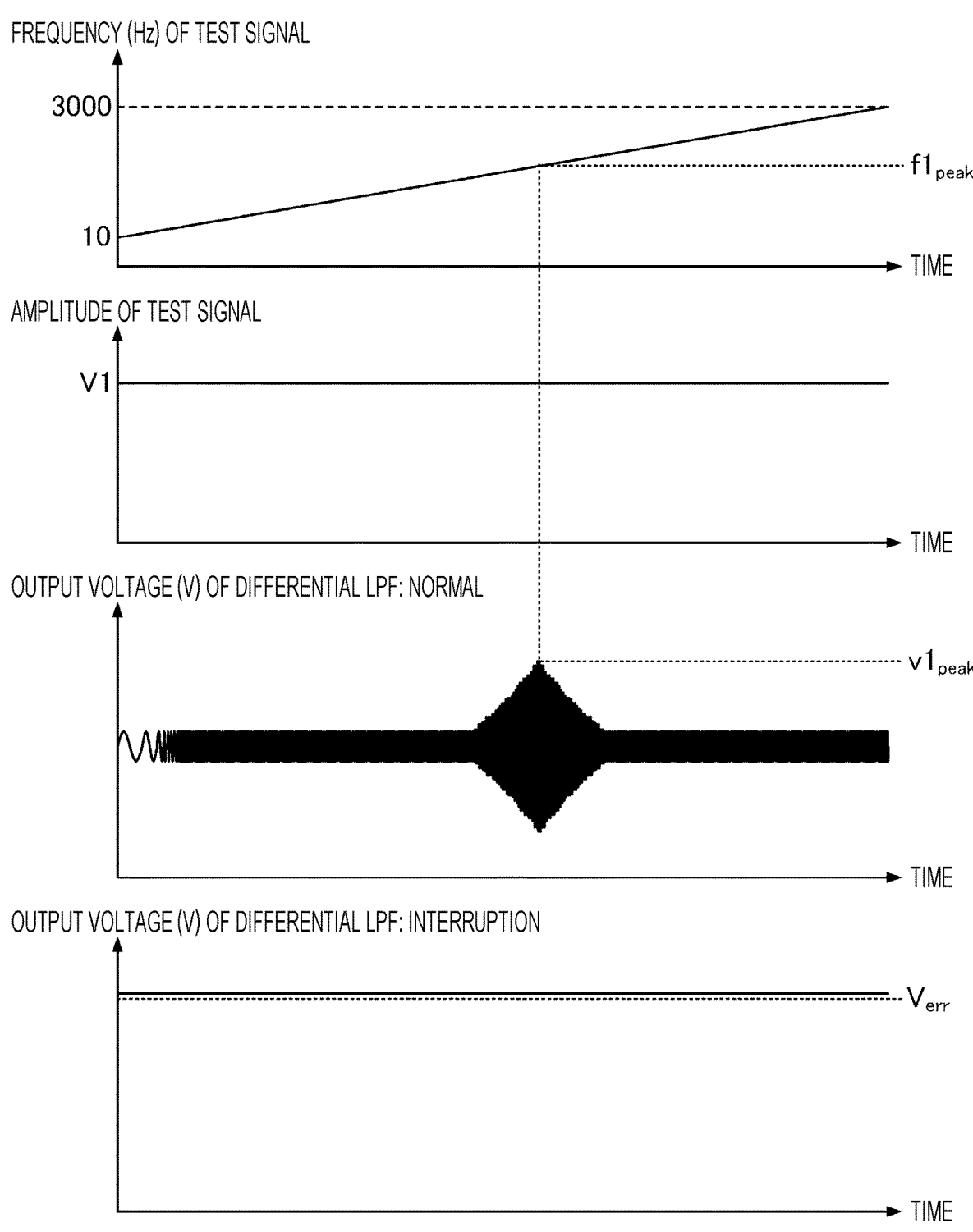
FIG. 9 is a diagram illustrating an example of a relationship between a test signal, a peak frequency, and a peak voltage.

FIG. 9 is a diagram illustrating an example of a relationship between the test signal, the peak frequency $f1_{peak}$, and the peak voltage $v1_{peak}$ in the inspection mode. In the example of FIG. 9, the test signal generation circuit 60 continuously changes the frequency of the test signal in the frequency band of 10 Hz or higher and 3 kHz or lower while maintaining the amplitude of the test signal at a constant voltage V1. When the sound reproduction device 3 is normal, the output voltage V' of the differential low-pass filter 71 reaches the peak voltage $v1_{peak}$ at the peak frequency $f1_{peak}$ of the test signal. On the other hand, when the sound reproduction device 3 fails, although not illustrated, the peak frequency $f1_{peak}$ or the peak voltage $v1_{peak}$ are shifted. As illustrated in FIG. 9, when an interruption failure occurs between the semiconductor device 1 and the sound reproduction device 3, the output voltage V' of the differential low-pass filter 71 is fixed to the power supply voltage. Therefore, when a predetermined voltage that is higher than the peak voltage $v1_{peak}$ in a normal state and is lower than the power supply voltage of the differential low-pass filter 71 is $V_{err}$, the determination circuit 61 can determine the interruption failure when the output voltage V' of the differential low-pass filter 71 is higher than the voltage $V_{err}$, that is, when the data DT is larger than a digital value corresponding to the voltage $V_{err}$.

Figure 10:
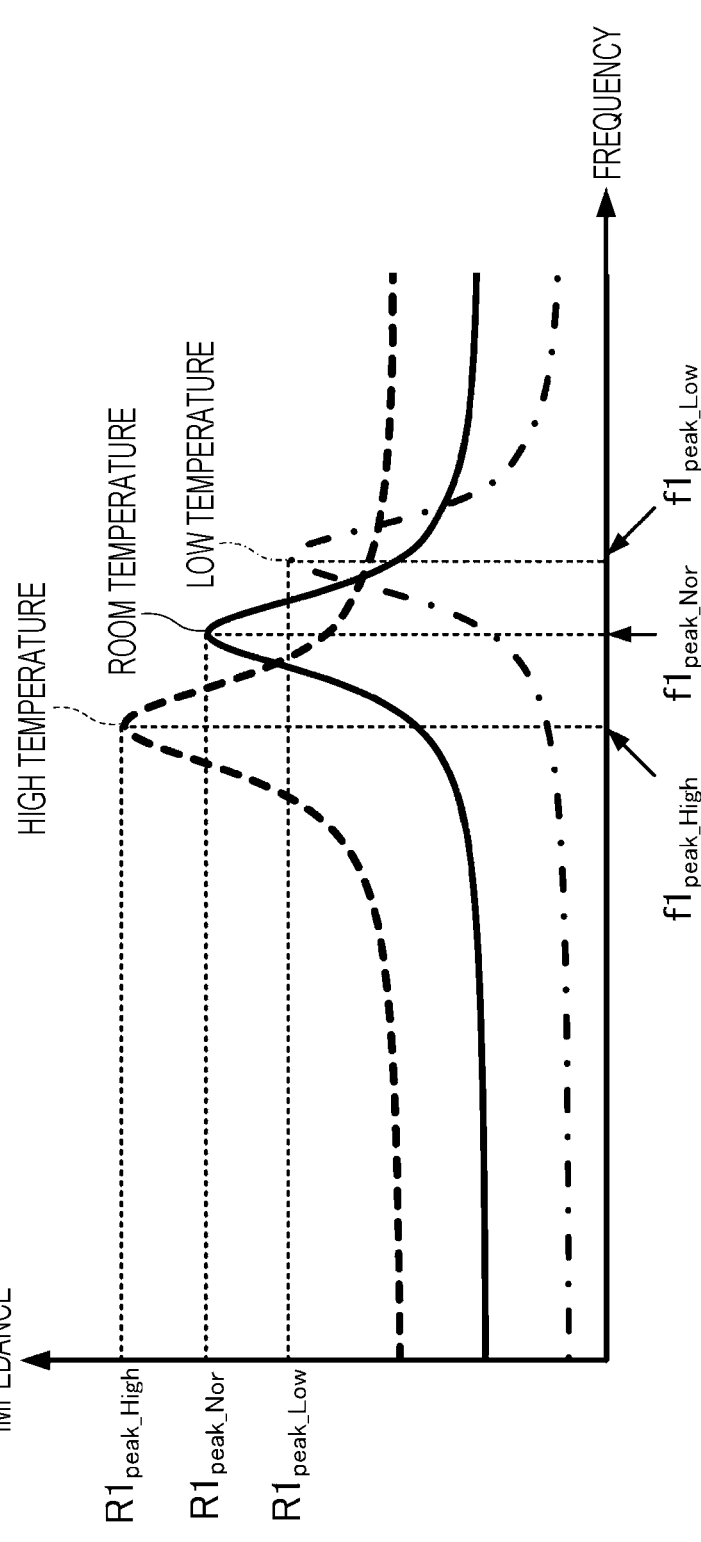
FIG. 10 is a diagram illustrating temperature dependencies of a peak impedance and the peak frequency.

As illustrated in FIG. 10, the peak impedance $R1_{peak}$ or the peak frequency $f1_{peak}$ changes depending on the temperature. The impedance $R1_{sp}$ is larger as the temperature of the sound reproduction device 3 is higher, and is smaller as the temperature of the sound reproduction device 3 is lower. For example, when a temperature range in which the operation of the sound reproduction device 3 is guaranteed is set to –40° C. to 80° C., a peak impedance $R1_{peak\_High}$ at a high temperature such as 80° C. is larger than a peak impedance $R1_{peak\_Nor}$ at a room temperature such as 25° C. In addition, a peak impedance $R1_{peak\_Low}$ at a low temperature such as –40° C. is smaller than a peak impedance $R1_{peak\_Nor}$ at a room temperature such as 25° C. As illustrated in FIG. 10, the peak frequency $f1_{peak}$ is lower as the temperature of the sound reproduction device 3 is higher, and is higher as the temperature of the sound reproduction device 3 is lower. Therefore, a peak frequency $f1_{peak\_High}$ at a high temperature such as 80° C. is lower than a peak frequency $f1_{peak\_Nor}$ at a room temperature such as 25° C. In addition, a peak frequency $f1_{peak\_Low}$ at a low temperature such as –40° C. is higher than the peak frequency $f1_{peak\_Nor}$ at a room temperature such as 25° C.

Figure 11:
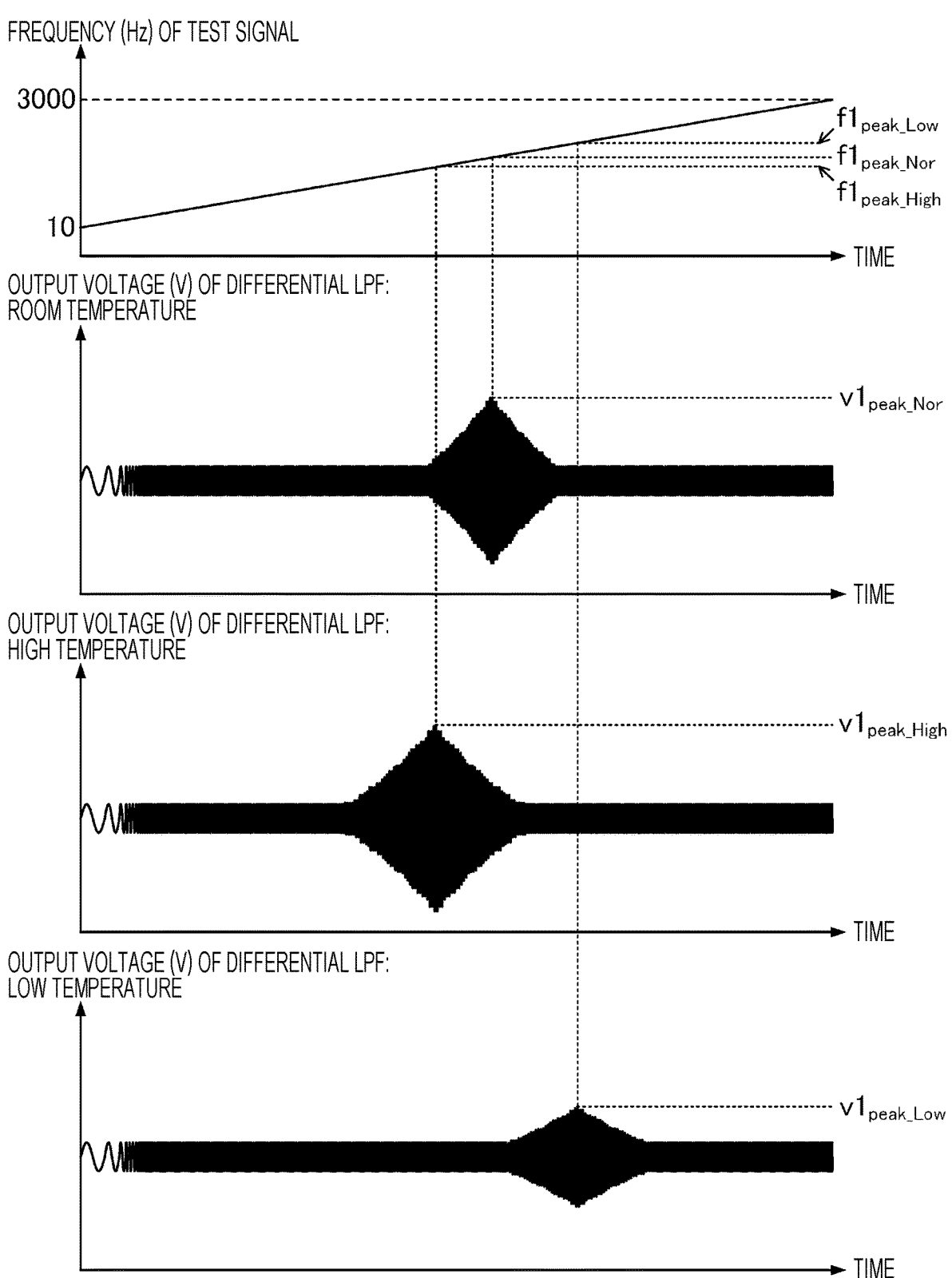
FIG. 11 is a diagram illustrating a temperature dependency of a waveform of an output voltage of the differential low-pass filter.

Since the peak impedance $R1_{peak}$ or the peak frequency $f1_{peak}$ changes depending on the temperature, as illustrated in FIG. 11, a waveform of the output voltage V' of the differential low-pass filter 71 also changes depending on the temperature.

Since the configurations of the class-D amplifiers 51Pa and 51Na, the peak frequency detection circuit 70a, and peripheral circuits thereof are the same as the configurations in FIGS. 6 and 7, the illustration and description thereof will be omitted. That is, the peak frequency detection circuit 70a includes the differential low-pass filter 71, the A/D conversion circuit 72, and the peak time measurement circuit 73, as in the peak frequency detection circuit 70. Since the configuration of the differential low-pass filter 71 included in the peak frequency detection circuit 70a is the same as the configuration in FIG. 8, the illustration and description thereof will be omitted. In addition, a relationship between the test signal, the peak frequency $f2_{peak}$, and the peak voltage $v2_{peak}$ in the inspection mode is the same as the relationship in FIG. 9, and thus the illustration and description thereof will be omitted. In addition, the temperature dependency of the peak impedance $R2_{peak}$ or the peak frequency $f2_{peak}$ of the sound reproduction device 3a is the same as the temperature dependency in FIG. 10, and thus the illustration and description thereof will be omitted. Since the temperature dependency of the waveform of the output voltage V' of the differential low-pass filter 71 included in the peak frequency detection circuit 70a is the same as the temperature dependency in FIG. 11, the illustration and description thereof will be omitted.

Here, when both the sound reproduction devices 3 and 3a are normal, the peak frequencies $f1_{peak}$ and $f2_{peak}$ change similarly depending on the temperature. Therefore, when the temperatures of the sound reproduction devices 3 and 3a change similarly, the difference between the peak frequency $f1_{peak}$ and the peak frequency $f2_{peak}$ does not change almost. Therefore, the determination circuit 61 determines whether or not the difference between the peak frequency $f1_{peak}$ detected by the peak frequency detection circuit 70 and the peak frequency $f2_{peak}$ detected by the peak frequency detection circuit 70a is included in a predetermined reference frequency difference range.

Similarly, when both the sound reproduction devices 3 and 3a are normal, the peak impedance $R1_{peak}$ and $R2_{peak}$ change similarly due to the temperature. Therefore, when the temperatures of the sound reproduction devices 3 and 3a change similarly, the difference between the peak impedance $R1_{peak}$ and the peak impedance $R2_{peak}$ does not change almost. Therefore, the determination circuit 61 determines whether or not a difference between the peak voltage $v1_{peak}$ detected by the peak frequency detection circuit 70 and the peak voltage $v2_{peak}$ detected by the peak frequency detection circuit 70a is included in the predetermined reference voltage difference range.

1-1-3. Processing Procedure in Inspection Mode

In the present embodiment, when the communication interface circuit 10 receives a command to switch the operation mode of the semiconductor device 1 to the inspection mode from the micro control unit 2, the operation mode of the semiconductor device 1 is switched to the inspection mode. When the supply of the power supply voltage to the semiconductor device 1 is started, the operation mode of the semiconductor device 1 may be automatically switched to the inspection mode. The inspection circuit 110 executes predetermined processing in the inspection mode.

Figure 12:
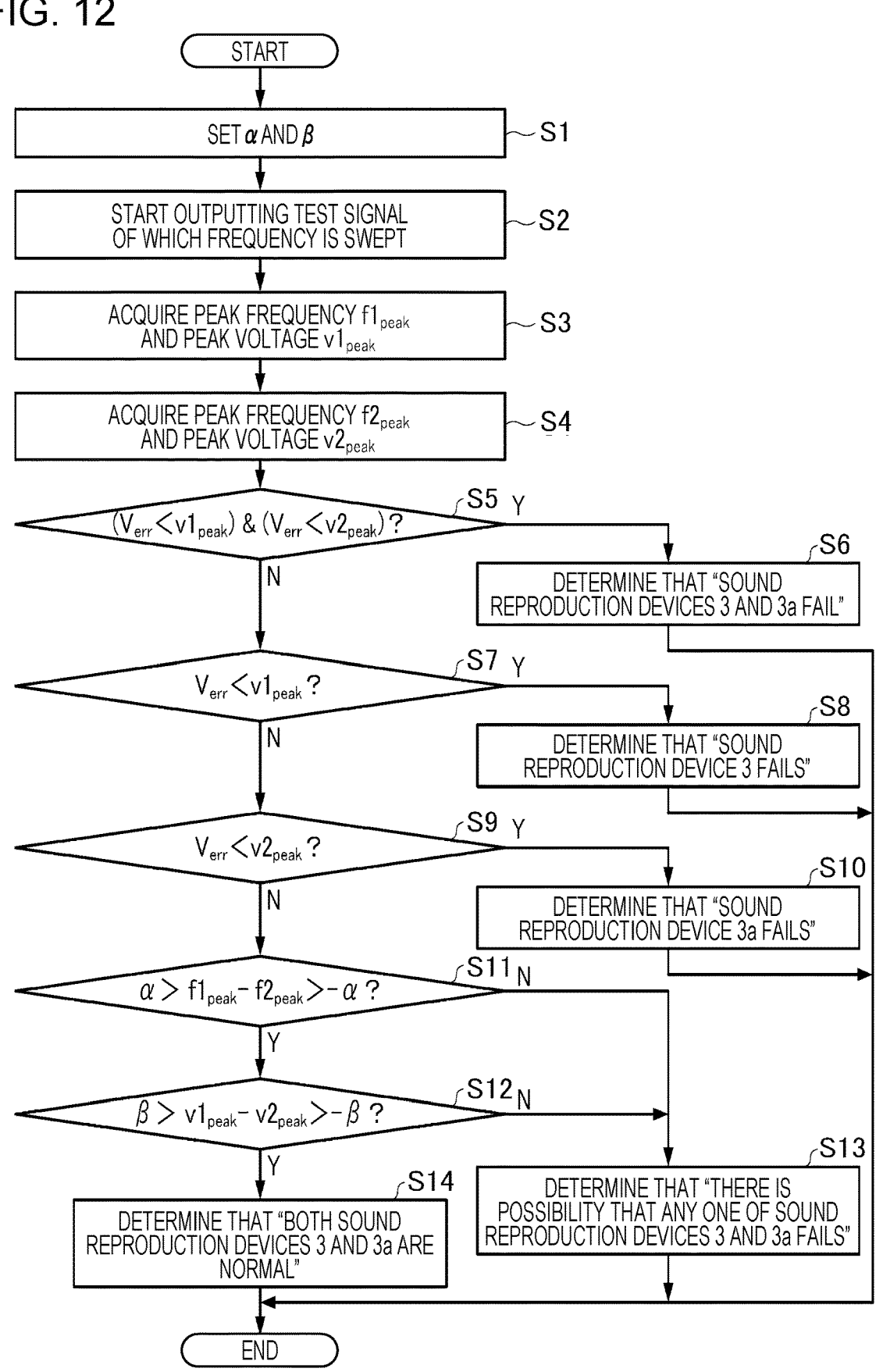
FIG. 12 is a flowchart illustrating an example of a processing procedure of an inspection circuit in an inspection mode.

FIG. 12 is a flowchart illustrating an example of a processing procedure of the inspection circuit 110 in the inspection mode.

First, in step S1, the determination circuit 61 sets the constants $\alpha$ and $\beta$. The constant $\alpha$ is a constant for determining the reference frequency difference range in consideration of the characteristic variation or the temperature difference of the sound reproduction devices 3 and 3a, and the constant $\beta$ is a constant for determining the reference voltage difference range in consideration of the characteristic variation and the temperature difference of the sound reproduction devices 3 and 3a. As described above, the constants $\alpha$ and $\beta$ are stored in the non-volatile memory of the memory 62, and the determination circuit 61 reads the constants $\alpha$ and $\beta$ from the non-volatile memory to set the constants $\alpha$ and $\beta$ in a predetermined internal register.

Then, in step S2, the test signal generation circuit 60 starts to output the test signal of which the frequency is swept, and in step S3, the determination circuit 61 acquires the peak frequency $f1_{peak}$ and the peak voltage $v1_{peak}$. In step S4, the determination circuit 61 acquires the peak frequency $f2_{peak}$ and the peak voltage $v2_{peak}$. Then, in step S5, the determination circuit 61 determines whether or not both the peak voltages $v1_{peak}$ and $v2_{peak}$ acquired in steps S3 and S4 are higher than the voltage $V_{err}$. When both the peak voltages $v1_{peak}$ and $v2_{peak}$ are higher than the voltage $V_{err}$, in step S6, the determination circuit 61 determines that both the sound reproduction devices 3 and 3a fail, and ends the processing in the inspection mode.

On the other hand, when any one of the peak voltages $v1_{peak}$ and $v2_{peak}$ is equal to or lower than the voltage $V_{err}$, in step S7, the determination circuit 61 determines whether or not the peak voltage $v1_{peak}$ is higher than the voltage $V_{err}$. When the peak voltage $v1_{peak}$ is higher than the voltage $V_{err}$, in step S8, the determination circuit 61 determines that the sound reproduction device 3 fails, and ends the processing in the inspection mode.

On the other hand, when the peak voltage $v1_{peak}$ is equal to or lower than the voltage $V_{err}$, in step S9, the determination circuit 61 determines whether or not the peak voltage $v2_{peak}$ is higher than the voltage $V_{err}$. When the peak voltage $v2_{peak}$ is higher than the voltage $V_{err}$, in step S10, the determination circuit 61 determines that the sound reproduction device 3a fails, and ends the processing in the inspection mode.

On the other hand, when the peak voltage $v2_{peak}$ is equal to or lower than the voltage $V_{err}$, in step S11, the determination circuit 61 determines whether or not the difference between the peak frequency $f1_{peak}$ acquired in step S3 and the peak frequency $f2_{peak}$ acquired in step S4 is included in the reference frequency difference range which is a range higher than -a and lower than to. When the difference between the peak frequency $f1_{peak}$ and the peak frequency $f2_{peak}$ is not included in the reference frequency difference range, in step S13, the determination circuit 61 determines that there is a possibility that any one of the sound reproduction devices 3 and 3a fails, and ends the processing in the inspection mode.

On the other hand, when the difference between the peak frequency $f1_{peak}$ and the peak frequency $f2_{peak}$ is included in the reference frequency difference range, in step S12, the determination circuit 61 determines whether or not the difference between the peak voltage $v1_{peak}$ acquired in step S3 and the peak voltage $v2_{peak}$ acquired in step S4 is included in the reference voltage difference range which is a range higher than-B and lower than +B. When the difference between the peak voltage $v1_{peak}$ and the peak voltage $v2_{peak}$ is not included in the reference voltage difference range, in step S13, the determination circuit 61 determines that there is a possibility that any one of the sound reproduction devices 3 and 3a fails, and ends the processing in the inspection mode. When the difference between the peak voltage $v1_{peak}$ and the peak voltage $v2_{peak}$ is included in the reference voltage difference range, in step S14, the determination circuit 61 determines that both the sound reproduction devices 3 and 3a are normal, and ends the processing in the inspection mode.

The sound reproduction device 3 is an example of a "first sound reproduction device", the terminal P1 of the sound reproduction device 3 is an example of a "first terminal of the first sound reproduction device", and the terminal P2 of the sound reproduction device 3 is an example of a "second terminal of the first sound reproduction device". The sound reproduction device 3a is an example of a "second sound reproduction device", the terminal P1a of the sound reproduction device 3a is an example of a "first terminal of the second sound reproduction device", and the terminal P2a of the sound reproduction device 3a is an example of a "second terminal of the second sound reproduction device". The output terminal 91 of the semiconductor device 1 is an example of a "first output terminal", and the output terminal 92 of the semiconductor device 1 is an example of a "second output terminal". The output terminal 93 of the semiconductor device 1 is an example of a "third output terminal", and the output terminal 94 of the semiconductor device 1 is an example of a "fourth output terminal". The sound source signal DI1 is an example of a "first sound source signal", and the sound source signal DI2 is an example of a "second sound source signal". The modulation circuit 30 is an example of a "first modulation circuit", the modulated signal DOP is an example of a "first modulated signal", and the modulated signal DON is an example of a "second modulated signal". The modulation circuit 30a is an example of a "second modulation circuit", the modulated signal DOPa is an example of a "third modulated signal", and the modulated signal DONa is an example of a "fourth modulated signal". The modulated signal TP is an example of a "fifth modulated signal", and the modulated signal TN is an example of a "sixth modulated signal". The amplification circuit 50 is an example of a "first amplification circuit", the amplified signal DOXP obtained by amplifying the modulated signal DOP is an example of a "first amplified signal", the amplified signal DOXN obtained by amplifying the modulated signal DON is an example of a "second amplified signal", the amplified signal DOXP obtained by amplifying the modulated signal TP is an example of a "third amplified signal", and the amplified signal DOXN obtained by amplifying the modulated signal TN is an example of a "fourth amplified signal". The amplification circuit 50a is an example of a "second amplification circuit", the amplified signal DOXPa obtained by amplifying the modulated signal DOPa is an example of a "fifth amplified signal", the amplified signal DOXNa obtained by amplifying the modulated signal DONa is an example of a "sixth amplified signal", the amplified signal DOXPa obtained by amplifying the modulated signal TP is an example of a "seventh amplified signal", and the amplified signal DOXNa obtained by amplifying the modulated signal TN is an example of an "eighth amplified signal". The peak frequency detection circuit 70 is an example of a "first peak frequency detection circuit", the peak frequency $f1_{peak}$ is an example of a "first peak frequency", and the peak voltage $v1_{peak}$ is an example of a "first peak voltage". The peak frequency detection circuit 70a is an example of a "second peak frequency detection circuit", the peak frequency $f2_{peak}$ is an example of a "second peak frequency", and the peak voltage $v2_{peak}$ is an example of a "second peak voltage". The differential low-pass filter 71, the A/D conversion circuit 72, and the peak time measurement circuit 73 included in the peak frequency detection circuit 70 are examples of a "first differential low-pass filter", a "first A/D conversion circuit", and a "first peak time measurement circuit", respectively. The differential low-pass filter 71, the A/D conversion circuit 72, and the peak time measurement circuit 73 included in the peak frequency detection circuit 70a are examples of a "second differential low-pass filter", a "second A/D conversion circuit", and a "second peak time measurement circuit", respectively. The normal operation mode is an example of a "first operation mode", and the inspection mode is an example of a "second operation mode".

The semiconductor device 1 according to the present embodiment is configured to cause two sound reproduction devices 3 and 3a to output the sound, but may be configured to cause three or more sound reproduction devices to output the sound.

1-1-4. Actions and Effects

As described above, with the semiconductor device 1 according to the present embodiment, in the normal operation mode, the amplification circuit 50 outputs the amplified signals DOXP and DOXN obtained by amplifying the modulated signals DOP and DON based on the sound source signal DI1 to the output terminals 91 and 92, respectively, so that the sound reproduction device 3 can reproduce the sound. In the normal operation mode, the amplification circuit 50a outputs the amplified signals DOXPa and DOXNa obtained by amplifying the modulated signals DOPa and DONa based on the sound source signal DI2 to the output terminals 93 and 94, respectively, so that the sound reproduction device 3a can reproduce the sound. On the other hand, in the inspection mode, the amplification circuit 50 outputs the amplified signals DOXP and DOXN obtained by amplifying the modulated signals TP and TN based on the test signal to the output terminals 91 and 92, respectively, so that the peak frequency detection circuit 70 can measure the potential difference between the output terminal 91 and the output terminal 92, to detect the peak frequency $f1_{peak}$ at which the impedance of the sound reproduction device 3 reaches the peak. In the inspection mode, the amplification circuit 50a outputs the amplified signals DOXPa and DOXNa obtained by amplifying the modulated signals TP and TN based on the test signal to the output terminals 93 and 94, respectively, so that the peak frequency detection circuit 70a can measure the potential difference between the output terminal 93 and the output terminal 94, to detect the peak frequency $f2_{peak}$ at which the impedance of the sound reproduction device 3a reaches the peak. When the temperatures of the sound reproduction devices 3 and 3a change similarly, the peak frequencies $f1_{peak}$ and $f2_{peak}$ also change similarly, and thus the difference therebetween is substantially constant regardless of the temperature. As a result, when both the sound reproduction devices 3 and 3a are normal, even when the peak frequencies $f1_{peak}$ and $f2_{peak}$ change due to the change in the temperature, the difference therebetween is included in the predetermined reference frequency difference range. Therefore, the determination circuit 61 can determine whether the difference between the peak frequency $f1_{peak}$ and the peak frequency $f2_{peak}$ is included in the predetermined reference frequency difference range, and determine that there is a possibility that any one of the sound reproduction devices 3 and 3a fails, for example, when the difference is not included in the reference frequency difference range. Therefore, with the semiconductor device 1 according to the present embodiment, the accuracy of the failure determination of the sound reproduction devices 3 and 3a can be maintained even when the temperature changes. In the semiconductor device 1 according to the present embodiment, the amplification circuit 50 is shared for the generation of the amplified signals DOXP and DOXN for causing the sound reproduction device 3 to reproduce the sound in the normal operation mode and the generation of the amplified signals DOXP and DOXN necessary for detecting the peak frequency $f1_{peak}$ in the inspection mode. Similarly, the amplification circuit 50a is shared for the generation of the amplified signals DOXPa and DOXNa for causing the sound reproduction device 3a to reproduce the sound in the normal operation mode and the generation of the amplified signals DOXPa and DOXNa necessary for detecting the peak frequency $f2_{peak}$ in the inspection mode. Therefore, with the semiconductor device 1 according to the present embodiment, the signal necessary for detecting the failures of the sound reproduction devices 3 and 3a can be generated by a small-scale circuit.

In addition, in the semiconductor device 1 according to the present embodiment, when the temperatures of the sound reproduction devices 3 and 3a change similarly, the peak voltages $v1_{peak}$ and $v2_{peak}$ also change similarly, and thus the difference therebetween is substantially constant regardless of the temperature. As a result, when both the sound reproduction devices 3 and 3a are normal, even when the peak voltages $v1_{peak}$ and $v2_{peak}$ change due to the change in the temperature, the difference therebetween is included in the predetermined reference voltage difference range. Therefore, the determination circuit 61 can determine whether the difference between the peak voltage $v1_{peak}$ and the peak voltage $v2_{peak}$ is included in the predetermined reference voltage difference range, and determine that there is a possibility that any one of the sound reproduction devices 3 and 3a fails, for example, when the difference is not included in the reference voltage difference range. Therefore, with the semiconductor device 1 according to the present embodiment, a risk that it is erroneously determined that any one of the sound reproduction devices 3 and 3a is normal when there is the possibility that any one of the sound reproduction devices 3 and 3a fails is reduced. In addition, with the semiconductor device 1 according to the present embodiment, the potential difference between the output terminal 91 and the output terminal 92 also reaches the peak when the impedance $R1_{sp}$ of the sound reproduction device 3 reaches the peak, and thus the peak frequency detection circuit 70 can detect the peak frequency $f1_{peak}$ by measuring the time when the potential difference between the output terminal 91 and the output terminal 92 reaches the maximum. Similarly, the potential difference between the output terminal 93 and the output terminal 94 also reaches the peak when the impedance $R2_{sp}$ of the sound reproduction device 3a reaches the peak, and thus the peak frequency detection circuit 70a can detect the peak frequency $f2_{peak}$ by measuring the time when the potential difference between the output terminal 93 and the output terminal 94 reaches the maximum.

In addition, with the semiconductor device 1 according to the present embodiment, in each of the peak frequency detection circuits 70 and 70a, the differential low-pass filter 71 can reduce the high-frequency noise component superimposed on the amplified signals DOXP and DOXN by modulating the test signal, the A/D conversion circuit 72 can convert the output voltage of the differential low-pass filter 71 into the data DT, and the peak time measurement circuit 73 can easily perform high-accuracy measurement.

In addition, with the semiconductor device 1 according to the present embodiment, since the impedance $R1_{sp}$ of the sound reproduction device 3 does not depend on the magnitude of the voltages of the amplified signals DOXP and DOXN and the impedance $R2_{sp}$ of the sound reproduction device 3a does not depend on the magnitude of the voltages of the amplified signals DOXPa and DOXNa, in the inspection mode, the peak frequencies $f1_{peak}$ and $f2_{peak}$ and the peak voltages $v1_{peak}$ and $v2_{peak}$ can be detected while the sound reproduction devices 3 and 3a reproduce a very small sound that is difficult to be heard by a human ear. Therefore, with the semiconductor device 1 according to the present embodiment, it can be made less noticeable to the user that the semiconductor device 1 is operating in the inspection mode.

1-2. Modification Example

In the above-described embodiment, the peak frequency detection circuit 70 detects the peak frequency $f1_{peak}$ and the peak voltage $v1_{peak}$, and the peak frequency detection circuit 70a detects the peak frequency $f2_{peak}$ and the peak voltage $v2_{peak}$, but the peak frequency detection circuit 70 may perform the detection of the peak frequency $f1_{peak}$ and the peak voltage $v1_{peak}$ and the detection of the peak frequency $f2_{peak}$ and the peak voltage $v2_{peak}$ by time division. In this case, the peak frequency detection circuit $70a$ is unnecessary. For example, in the inspection mode, first, the test signal generation circuit 60 outputs the test signal of which the frequency is swept, and the peak frequency detection circuit 70 detects the peak frequency $f1_{peak}$ and the peak voltage $v1_{peak}$. Then, the test signal generation circuit 60 may output the test signal of which the frequency is swept again, and the peak frequency detection circuit 70 may detect the peak frequency $f2_{peak}$ and the peak voltage $v2_{peak}$.

In the above-described embodiment, the memory 20 in which the sound source data 21-1 to 21-$n$ is stored is built in the semiconductor device 1, but an external memory in which the sound source data 21-1 to 21-$n$ are stored may be coupled to the semiconductor device 1 instead of the memory 20, and the semiconductor device 1 may read the sound source data 21-$i$, which is the sound source signal DI1, and the sound source data 21-$j$, which is the sound source signal DI2, from the external memory. Alternatively, the micro control unit 2 may be built in a memory in which the sound source data 21-1 to 21-$n$ is stored instead of the memory 20, and the micro control unit 2 may read the sound source data 21-$i$ from the memory and transmit the sound source data 21-$i$ and 21-$j$ as the sound source signals DI1 and DI2 to the semiconductor device 1.

Figure 13:
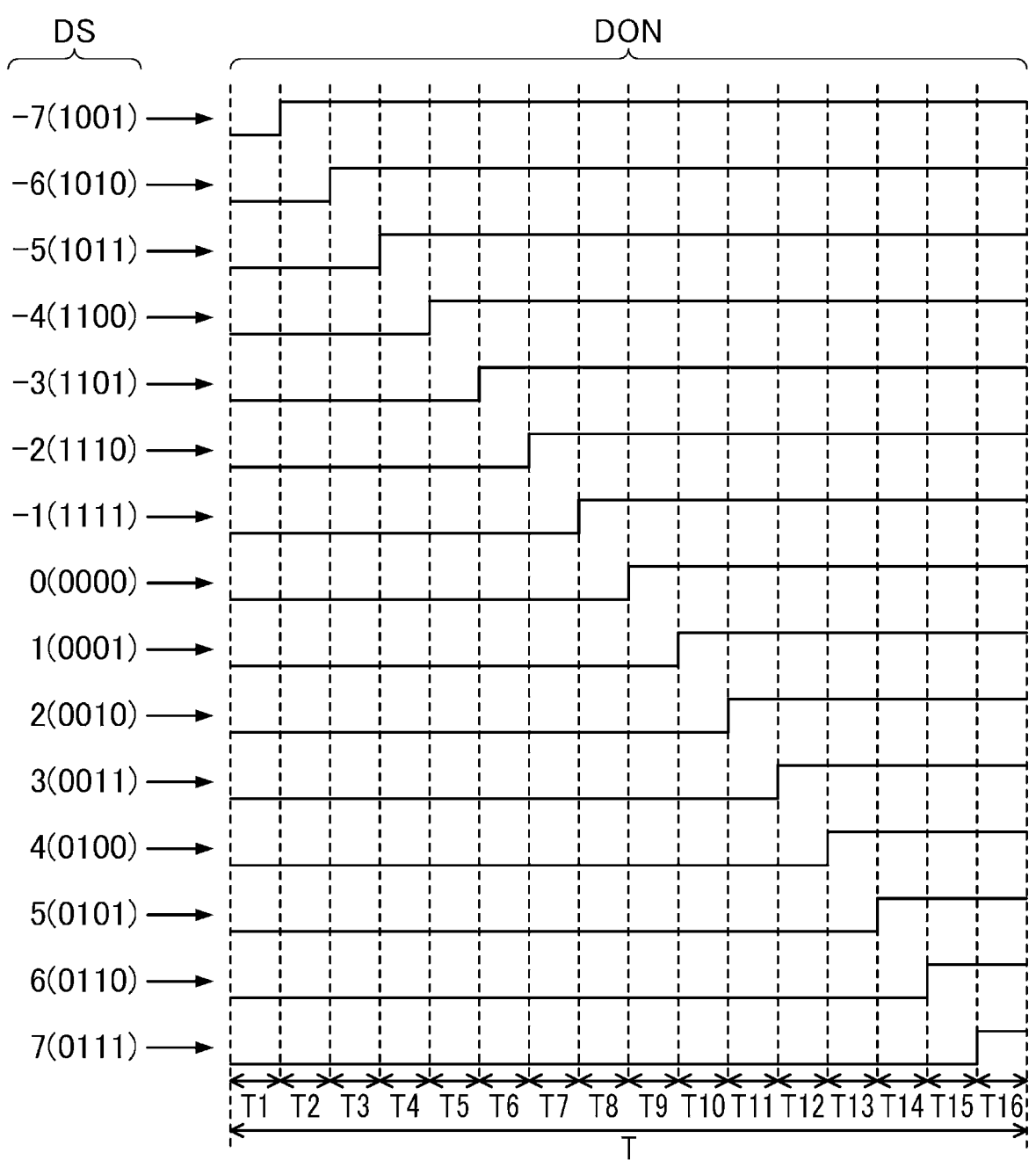
FIG. 13 is a diagram illustrating another example of the pulse width modulation for generating the modulated signal.
Figure 14:
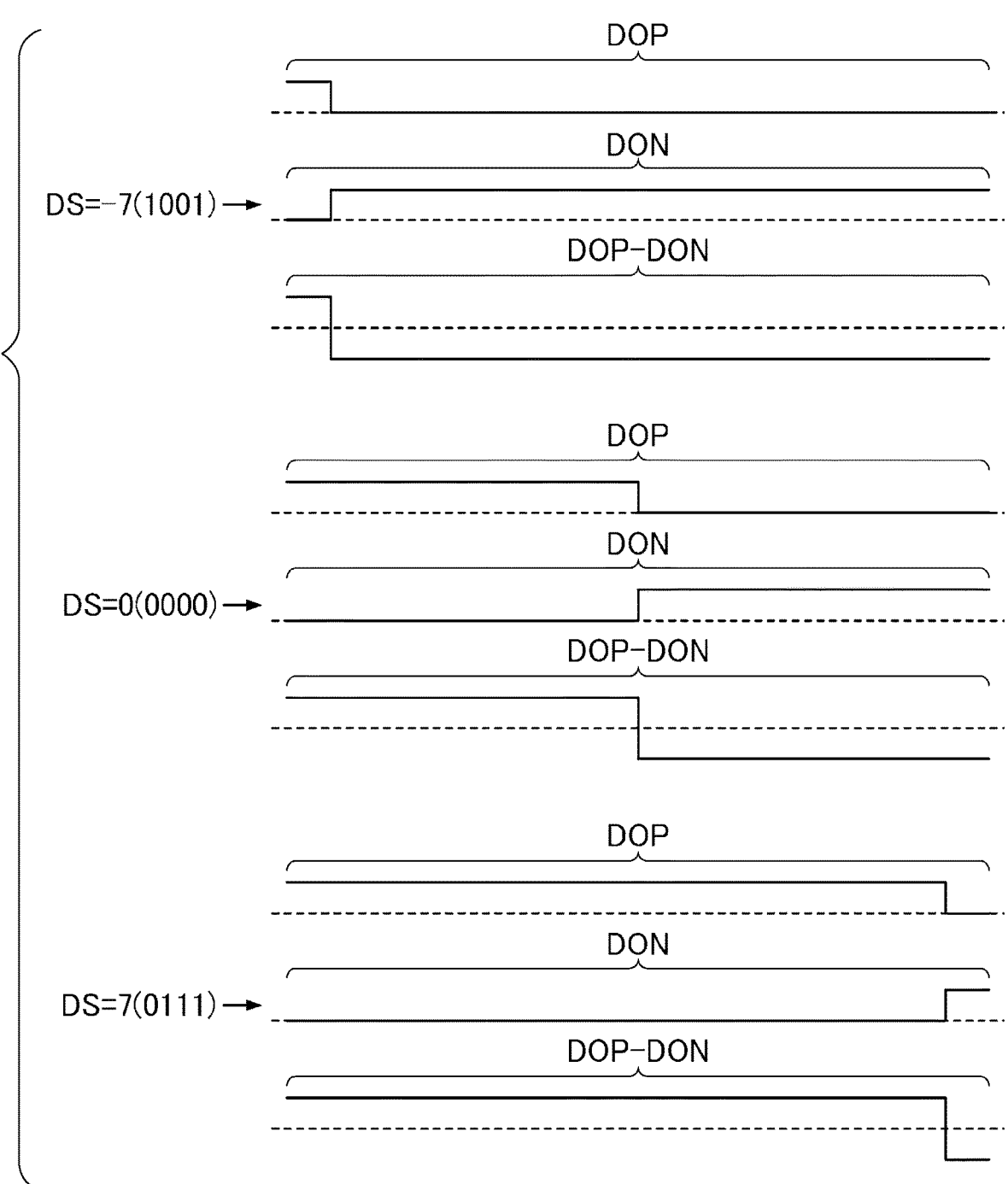
FIG. 14 is a diagram illustrating another example of the difference between the modulated signal and the modulated signal.

In addition, in the above-described embodiment, the examples of FIGS. 2 to 4 are described as the modulation method via the pulse width modulation circuit 33, but other modulation methods may be used. For example, the pulse width modulation for generating the modulated signal DOP may be the same as the method illustrated in FIG. 2, and the pulse width modulation for generating the modulated signal DON may be the method illustrated in FIG. 13. In the example of FIG. 13, the modulated signal DON is a signal obtained by inverting a logic level of the modulated signal DOP illustrated in FIG. 2, and a high-level time is shorter as the value of the sigma-delta modulated signal DS is larger. For example, when the sigma-delta modulated signal DS is "−7" in decimal, that is, "1001" in binary, the modulated signal DON is at a low level in the one section T1 and is at a high level in the 15 sections T2 to T16. For example, when the sigma-delta modulated signal DS is "0" in decimal, that is, "0000" in binary, the modulated signal DON is at a low level in the eight sections T1 to T8 and is at a high level in the eight sections T9 to T16. For example, when the sigma-delta modulated signal DS is "7" in decimal, that is, "0111" in binary, the modulated signal DON is at a low level in the 15 sections T1 to T15 and is at a high level in the one section T16. Therefore, for example, a difference between the modulated signal DOP and the modulated signal DON when the sigma-delta modulated signal DS is "−7", "0", and "7" in decimal is as illustrated in FIG. 14. The pulse width modulation for generating the modulated signal DONa may be the method illustrated in FIG. 13.

2. Electronic Apparatus

Figure 15:
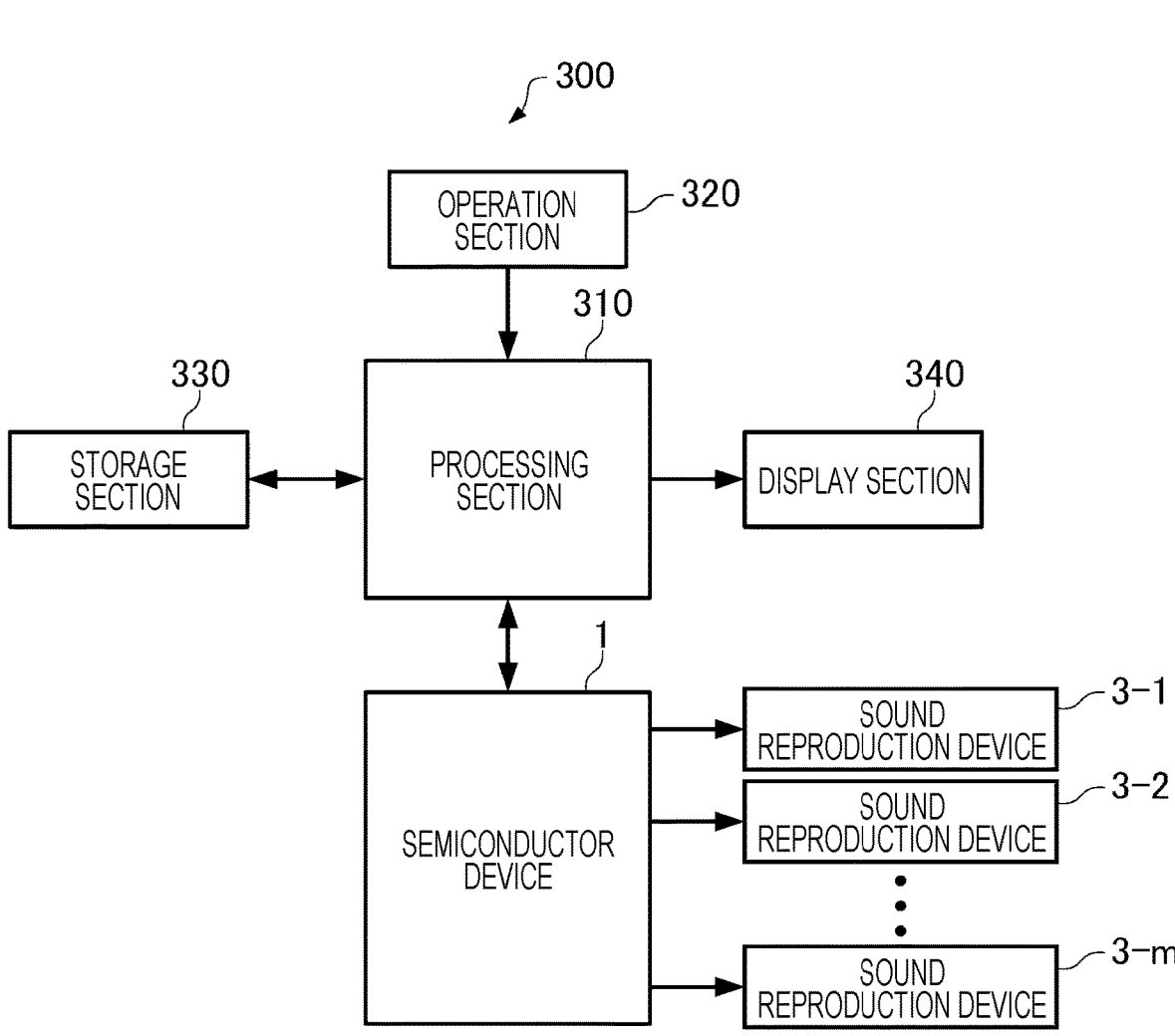
FIG. 15 is a functional block diagram of an electronic apparatus according to the present embodiment.

FIG. 15 is a functional block diagram illustrating an example of a configuration of an electronic apparatus according to the present embodiment using the semiconductor device 1 according to the present embodiment.

As illustrated in FIG. 15, an electronic apparatus 300 according to the present embodiment includes the semiconductor device 1, m sound reproduction devices 3-1 to 3-$m$, a processing section 310, an operation section 320, a storage section 330, and a display section 340. The electronic apparatus 300 according to the present embodiment may be configured by omitting or changing some of the components of FIG. 15, or by adding other components.

The processing section 310 performs control processing or various types of data processing of each section of the electronic apparatus 300. For example, the processing section 310 transmits various commands to the semiconductor device 1 to control the operation of the semiconductor device 1. The processing section 310 performs various types of processing corresponding to the operation signal from the operation section 320, processing of transmitting a display signal for displaying various types of information on the display section 340, and the like. For example, the processing section 310 may be the micro control unit 2.

The operation section 320 is an input device configured with an operation key, a button switch, or the like, and outputs an operation signal corresponding to the operation via the user to the processing section 310.

The storage section 330 stores a program, data, or the like for the processing section 310 to perform various types of calculation processing or control processing. The storage section 330 is realized by, for example, a hard disk, a flexible disk, an MO, an MT, various memories, a CD-ROM, or a DVD-ROM.

The display section 340 is a display device configured by an LCD or the like, and displays various types of information based on the input display signal. LCD is an abbreviation for Liquid Crystal Display. A touch panel that functions as the operation section 320 may be provided on the display section 340.

The semiconductor device 1 generates a plurality of sound signals based on various commands transmitted from the processing section 310 in the normal operation mode, and outputs the sound signal to sound reproduction devices 3-1 and 3-2. As a result, a desired sound is output from the sound reproduction devices 3-1 and 3-2. The sound reproduction device 3-1 corresponds to the sound reproduction device 3, and the sound reproduction device 3-2 corresponds to the sound reproduction device 3$a$. In the inspection mode, the semiconductor device 1 outputs the amplified signals DOXP and DOXN based on the test signal to the sound reproduction device 3-1, and outputs the amplified signals DOXPa and DOXNa based on the test signal to the sound reproduction device 3-2. As a result, the sound is output from the sound reproduction devices 3-1 and 3-2, and thus it is preferable that a very small sound that is difficult to be heard by a human ear is output. That is, it is preferable that a volume of the sound reproduced by the sound reproduction devices 3-1 and 3-2 in the inspection mode is smaller than a minimum value of a volume of the sound reproduced by the sound reproduction devices 3-1 and 3-2 in the normal operation mode. As a result, it can be made less noticeable to a user that the semiconductor device 1 is operating in the inspection mode. Then, the semiconductor device 1 may inspect the sound reproduction devices 3-1 and 3-2 and transmit an inspection result to the processing section 310, and the processing section 310 may determine the presence or absence of the failure or a failure mode of the sound reproduction devices 3-1 and 3-2. When the sound reproduction device 3-1 fails, the processing section 310 may cause, for example, any one of the sound reproduction devices 3-3 to 3-$m$ to reproduce a voice for notifying that the sound reproduction device 3-1 fails, or may switch an output destination of the sound signal from the sound reproduction device 3-1 to any one of the sound reproduction devices 3-3 to 3-$m$. When the sound reproduction device 3-2 fails, the processing section 310 may cause, for example, any one of the sound reproduction devices 3-3 to 3-*m* to reproduce a voice for notifying that the sound reproduction device 3-2 fails, or may switch an output destination of the sound signal from the sound reproduction device 3-2 to any one of the sound reproduction devices 3-3 to 3-*m*.

Since the semiconductor device 1 can generate the signal necessary for detecting the failures of the sound reproduction devices 3-1 and 3-2, the electronic apparatus 300 having high reliability can be realized.

Various electronic apparatuses can be considered as the electronic apparatus 300, and examples thereof include a warning device, various household electrical appliances such as a rice cooker, an IH cooking heater, a vacuum cleaner, and a washing machine, an electronic clock, mobile, laptop, and tablet type personal computers, a mobile terminal such as a smartphone or a mobile phone, a digital camera, an ink jet ejection apparatus such as an ink jet printer, a storage area network device such as a router or a switch, a local area network device, a mobile terminal base station device, a TV, a video camera, a video recorder, a car navigation device, a real-time clock device, a pager, an electronic notebook, an electronic dictionary, a calculator, an electronic game device, a game controller, a word processor, a workstation, a videophone, a security TV monitor, electronic binoculars, a POS terminal, a medical device such as an electronic thermometer, a blood pressure monitor, a blood sugar meter, an electrocardiogram measurement device, an ultrasound diagnostic device, or an electronic endoscope, a fish finder, various measurement devices, meters and gauges for a vehicle, an aircraft, or a ship, a flight simulator, a head-mounted display, motion trace, motion tracking, a motion controller, and a pedestrian autonomous navigation device.

Figure 16:
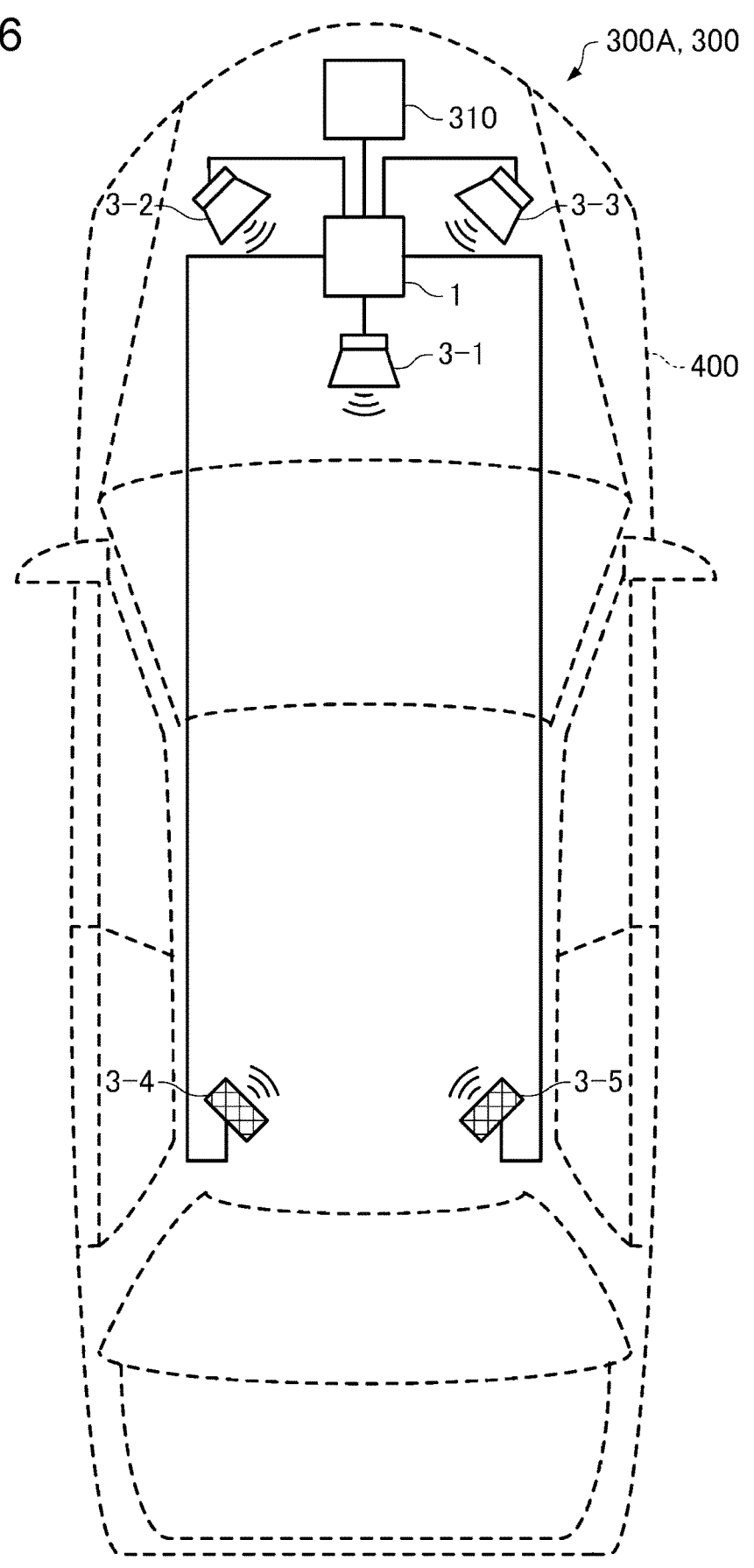
FIG. 16 is a diagram illustrating a configuration example of a warning device that is an example of the electronic apparatus.

FIG. 16 is a diagram illustrating a configuration example of a warning device 300A, which is an example of the electronic apparatus 300. In FIG. 16, the same components as the components in FIG. 15 are denoted by the same reference numerals. The warning device 300A illustrated in FIG. 16 is mounted in a vehicle 400. The sound reproduction devices 3-1 to 3-3 are speakers, and the sound reproduction devices 3-4 and 3-5 are buzzers.

The processing section 310 transmits various sound reproduction commands and the like to the semiconductor device 1 based on signals from various sensors (not illustrated). Examples of the various sounds include an audio or a warning sound imitating a voice of a human for notifying of an abnormality in a brake, an engine oil, a power steering, a brake override system, and the like, running with a door not properly closed, zigzag running with a parking brake not released, a seat belt being not worn, and an approach to a preceding vehicle, and the like, and an effect sound for notifying of a blinker, a hazard lamp, reverse movement.

The semiconductor device 1 generates a plurality of sound signals based on a part of a plurality of sound source data corresponding to various sounds based on the command from the processing section 310, and outputs the generated sound signal to the sound reproduction devices 3-1 and 3-2. In addition, the semiconductor device 1 may inspect the sound reproduction devices 3-1 and 3-2 and transmit an inspection result to the processing section 310, and the processing section 310 may determine the presence or absence of the failure or a failure mode of the sound reproduction devices 3-1 and 3-2. When the sound reproduction device 3-1 fails, the processing section 310 may cause, for example, any one of the sound reproduction devices 3-3 to 3-5 to reproduce a voice for notifying that the sound reproduction device 3-1 fails, or may switch an output destination of the sound signal from the sound reproduction device 3-1 to any one of the sound reproduction devices 3-3 to 3-5. When the sound reproduction device 3-2 fails, the processing section 310 may cause, for example, any one of the sound reproduction devices 3-3 to 3-5 to reproduce a voice for notifying that the sound reproduction device 3-2 fails, or may switch an output destination of the sound signal from the sound reproduction device 3-2 to any one of the sound reproduction devices 3-3 to 3-5.

Since the semiconductor device 1 can generate the signal necessary for detecting the failures of the sound reproduction devices 3-1 and 3-2, the warning device 300A having high reliability can be realized.

The present disclosure is not limited to the present embodiment, and various modifications can be made within the scope of the spirit of the present disclosure.

The above-described embodiment and modification example are merely examples, and the present disclosure is not limited thereto. For example, each embodiment and each modification example can be combined as appropriate.

The present disclosure includes a configuration that is substantially the same as the configurations described in the embodiment, for example, a configuration that has the same function, method, and result, or a configuration that has the same object and effect. The present disclosure includes a configuration in which non-essential parts of the configurations described in the embodiment are replaced. In addition, the present disclosure includes a configuration that has the same effects or a configuration that can achieve the same object as the configurations described in the embodiment. The present disclosure includes a configuration in which a known technique is added to the configurations described in the embodiment.

The following contents are derived from the above-described embodiment and modification example.

An aspect of the semiconductor device is a semiconductor device including: a first output terminal coupled to a first terminal of a first sound reproduction device; a second output terminal coupled to a second terminal of the first sound reproduction device; a third output terminal coupled to a first terminal of a second sound reproduction device; a fourth output terminal coupled to a second terminal of the second sound reproduction device; a first modulation circuit that, in a first operation mode, modulates a signal based on a first sound source signal to output a first modulated signal and a second modulated signal; a second modulation circuit that, in the first operation mode, modulates a signal based on a second sound source signal to output a third modulated signal and a fourth modulated signal; a test signal generation circuit that, in a second operation mode, modulates a test signal of which a frequency is changed in a frequency band set in advance, to generate a fifth modulated signal and a sixth modulated signal; a first amplification circuit that, in the first operation mode, outputs a first amplified signal obtained by amplifying the first modulated signal to the first output terminal and outputs a second amplified signal obtained by amplifying the second modulated signal to the second output terminal and that, in the second operation mode, outputs a third amplified signal obtained by amplifying the fifth modulated signal to the first output terminal and outputs a fourth amplified signal obtained by amplifying the sixth modulated signal to the second output terminal; a second amplification circuit that, in the first operation mode, outputs a fifth amplified signal obtained by amplifying the third modulated signal to the third output terminal and outputs a sixth amplified signal obtained by amplifying the fourth modulated signal to the fourth output terminal and that, in the second operation mode, outputs a seventh amplified signal obtained by amplifying the fifth modulated signal to the third output terminal and outputs an eighth amplified signal obtained by amplifying the sixth modulated signal to the fourth output terminal; a first peak frequency detection circuit that, in the second operation mode, measures a potential difference between the first output terminal and the second output terminal to detect a first peak frequency that is a frequency of the test signal at which an impedance of the first sound reproduction device reaches a peak; a second peak frequency detection circuit that, in the second operation mode, measures a potential difference between the third output terminal and the fourth output terminal to detect a second peak frequency that is a frequency of the test signal at which an impedance of the second sound reproduction device reaches a peak; and a determination circuit that determines whether or not a difference between the first peak frequency and the second peak frequency is included in a predetermined reference frequency difference range.

With the semiconductor device, in the first operation mode, the first amplification circuit outputs the first amplified signal obtained by amplifying the first modulated signal based on the first sound source signal to the first output terminal, and outputs the second amplified signal obtained by amplifying the second modulated signal based on the first sound source signal to the second output terminal, so that the first sound reproduction device can reproduce the sound. In the first operation mode, the second amplification circuit outputs the fifth amplified signal obtained by amplifying the third modulated signal based on the second sound source signal to the third output terminal, and outputs the sixth amplified signal obtained by amplifying the fourth modulated signal based on the second sound source signal to the fourth output terminal, so that the second sound reproduction device can reproduce the sound. On the other hand, in the second operation mode, the first amplification circuit outputs the third amplified signal obtained by amplifying the fifth modulated signal based on the test signal to the first output terminal, and outputs the fourth amplified signal obtained by amplifying the sixth modulated signal based on the test signal to the second output terminal, so that the first peak frequency detection circuit can measure the potential difference between the first output terminal and the second output terminal, to detect the first peak frequency at which the impedance of the first sound reproduction device reaches the peak. In the second operation mode, the second amplification circuit outputs the seventh amplified signal obtained by amplifying the fifth modulated signal based on the test signal to the third output terminal, and outputs the eighth amplified signal obtained by amplifying the sixth modulated signal based on the test signal to the fourth output terminal, so that the second peak frequency detection circuit can measure the potential difference between the third output terminal and the fourth output terminal, to detect the second peak frequency at which the impedance of the second sound reproduction device reaches the peak. When the temperature of the first sound reproduction device and the temperature of the second sound reproduction device change similarly, the first peak frequency and the second peak frequency also change similarly, and thus the difference therebetween is substantially constant regardless of the temperature. As a result, when both the first sound reproduction device and the second sound reproduction device are normal, even when the first peak frequency and the second peak frequency change due to the change in the temperature, the difference therebetween is included in the predetermined reference frequency difference range. Therefore, the determination circuit can determine whether or not the difference between the first peak frequency and the second peak frequency is included in the predetermined reference frequency difference range, and determine that there is a possibility that the first sound reproduction device or the second sound reproduction device fails, for example, when the difference is not included in the reference frequency difference range. Therefore, with the semiconductor device, the accuracy of the failure determination of the first sound reproduction device and the second sound reproduction device can be maintained even when the temperature changes.

In the semiconductor device, the first amplification circuit is shared for the generation of the first amplified signal and the second amplified signal for causing the first sound reproduction device to reproduce the sound in the first operation mode, and the generation of the third amplified signal and the fourth amplified signal necessary for detecting the first peak frequency in the second operation mode. Similarly, the second amplification circuit is shared for the generation of the fifth amplified signal and the sixth amplified signal for causing the second sound reproduction device to reproduce the sound in the first operation mode, and the generation of the seventh amplified signal and the eighth amplified signal necessary for detecting the second peak frequency in the second operation mode. Therefore, with the semiconductor device, a signal necessary for detecting the failure of the first sound reproduction device and the second sound reproduction device can be generated by a small-scale circuit.

In the semiconductor device according to the aspect, in the second operation mode, the first peak frequency detection circuit may further detect a first peak voltage that is a voltage obtained by amplifying the potential difference between the first output terminal and the second output terminal when the frequency of the test signal is the first peak frequency, in the second operation mode, the second peak frequency detection circuit may further detect a second peak voltage that is a voltage obtained by amplifying the potential difference between the third output terminal and the fourth output terminal when the frequency of the test signal is the second peak frequency, and the determination circuit may further determine whether or not a difference between the first peak voltage and the second peak voltage is included in a predetermined reference voltage difference range.

In the semiconductor device, when the temperature of the first sound reproduction device and the temperature of the second sound reproduction device change similarly, the first peak voltage and the second peak voltage also change similarly, and thus the difference therebetween is substantially constant regardless of the temperature. As a result, when both the first sound reproduction device and the second sound reproduction device are normal, even when the first peak voltage and the second peak voltage change due to the change in the temperature, the difference therebetween is included in the predetermined reference voltage difference range. Therefore, the determination circuit can determine whether or not the difference between the first peak voltage and the second peak voltage is included in the predetermined reference voltage difference range, and determine, even when the difference between the first peak frequency and the second peak frequency is included in the predetermined reference frequency difference range, that there is a possibility that the first sound reproduction device or the second sound reproduction device fails as long as the difference between the first peak voltage and the second peak voltage is not included in the predetermined reference voltage difference range. Therefore, with the semiconductor device, a risk that it is erroneously determined that both the first sound reproduction device and the second sound reproduction device are normal when there is the possibility that the first sound reproduction device or the second sound reproduction device fails is reduced.

In the semiconductor device according to the aspect, in the second operation mode, the first peak frequency detection circuit may detect the first peak frequency by measuring a time when the potential difference between the first output terminal and the second output terminal reaches a maximum, and in the second operation mode, the second peak frequency detection circuit may detect the second peak frequency by measuring a time when the potential difference between the third output terminal and the fourth output terminal reaches a maximum.

With the semiconductor device, the potential difference between the first output terminal and the second output terminal also reaches the peak when the impedance of the first sound reproduction device reaches the peak, and thus the first peak frequency detection circuit can detect the first peak frequency by measuring the time when the potential difference between the first output terminal and the second output terminal reaches the maximum. Similarly, the potential difference between the third output terminal and the fourth output terminal also reaches the peak when the impedance of the second sound reproduction device reaches the peak, and thus the second peak frequency detection circuit can detect the second peak frequency by measuring the time when the potential difference between the third output terminal and the fourth output terminal reaches the maximum.

In the semiconductor device according to the aspect, the first peak frequency detection circuit may include a first differential low-pass filter to which a voltage of the first output terminal and a voltage of the second output terminal are input, a first A/D conversion circuit that converts an output voltage of the first differential low-pass filter into a digital signal, and a first peak time measurement circuit that measures the time when the potential difference between the first output terminal and the second output terminal reaches the maximum, based on the digital signal output from the first A/D conversion circuit, and the second peak frequency detection circuit may include a second differential low-pass filter to which a voltage of the third output terminal and a voltage of the fourth output terminal are input, a second A/D conversion circuit that converts an output voltage of the second differential low-pass filter into a digital signal, and a second peak time measurement circuit that measures the time when the potential difference between the third output terminal and the fourth output terminal reaches the maximum, based on the digital signal output from the second A/D conversion circuit.

With the semiconductor device, the first differential low-pass filter can reduce the high-frequency noise component superimposed on the fifth amplified signal and the sixth amplified signal by modulating the test signal, the first A/D conversion circuit can convert the output voltage of the first differential low-pass filter into the digital signal, and the first peak time measurement circuit can easily perform high-accuracy measurement. Similarly, with the semiconductor device, the second differential low-pass filter can reduce the high-frequency noise component superimposed on the fifth amplified signal and the sixth amplified signal by modulating the test signal, the second A/D conversion circuit can convert the output voltage of the second differential low-pass filter into the digital signal, and the second peak time measurement circuit can easily perform high-accuracy measurement.

In the semiconductor device according to the aspect, a cutoff frequency of the first differential low-pass filter and a cutoff frequency of the second differential low-pass filter may be higher than a maximum frequency of the frequency band.

With the semiconductor device, since the cutoff frequency of the first differential low-pass filter is higher than the maximum frequency of the frequency band in which the frequency of the test signal is changed, a frequency component included in the frequency band is not attenuated by the first differential low-pass filter, and the first peak time measurement circuit can perform high-accuracy measurement. Similarly, with the semiconductor device, since the cutoff frequency of the second differential low-pass filter is higher than the maximum frequency of the frequency band in which the frequency of the test signal is changed, a frequency component included in the frequency band is not attenuated by the second differential low-pass filter, and the second peak time measurement circuit can perform high-accuracy measurement.

An aspect of the electronic apparatus is an electronic apparatus including: the semiconductor device according to the above-described aspect; the first sound reproduction device; and the second sound reproduction device.

With the electronic apparatus, the semiconductor device that can generate the signal necessary for detecting the failure of the first sound reproduction device and the failure of the second sound reproduction device is provided, and thus the reliability can be improved.

In the electronic apparatus according to the aspect, a volume of a sound reproduced by each of the first sound reproduction device and the second sound reproduction device in the second operation mode may be smaller than a minimum value of a volume of a sound reproduced by each of the first sound reproduction device and the second sound reproduction device in the first operation mode.

With the electronic apparatus, since the sound output from each of the first sound reproduction device and the second sound reproduction device in the second operation mode is a very small sound that is difficult to be heard by a human ear, it can be made less noticeable to the user that the semiconductor device is operating in the second operation mode.

What is claimed is:

1. A semiconductor device comprising:
   a first output terminal coupled to a first terminal of a first sound reproduction device;
   a second output terminal coupled to a second terminal of the first sound reproduction device;
   a third output terminal coupled to a first terminal of a second sound reproduction device;
   a fourth output terminal coupled to a second terminal of the second sound reproduction device;
   a first modulation circuit that, in a first operation mode, modulates a signal based on a first sound source signal to output a first modulated signal and a second modulated signal;
   a second modulation circuit that, in the first operation mode, modulates a signal based on a second sound source signal to output a third modulated signal and a fourth modulated signal;
   a test signal generation circuit that, in a second operation mode, modulates a test signal of which a frequency is changed in a frequency band set in advance, to generate a fifth modulated signal and a sixth modulated signal;

a first amplification circuit that, in the first operation mode, outputs a first amplified signal obtained by amplifying the first modulated signal to the first output terminal and outputs a second amplified signal obtained by amplifying the second modulated signal to the second output terminal and that, in the second operation mode, outputs a third amplified signal obtained by amplifying the fifth modulated signal to the first output terminal and outputs a fourth amplified signal obtained by amplifying the sixth modulated signal to the second output terminal;

a second amplification circuit that, in the first operation mode, outputs a fifth amplified signal obtained by amplifying the third modulated signal to the third output terminal and outputs a sixth amplified signal obtained by amplifying the fourth modulated signal to the fourth output terminal and that, in the second operation mode, outputs a seventh amplified signal obtained by amplifying the fifth modulated signal to the third output terminal and outputs an eighth amplified signal obtained by amplifying the sixth modulated signal to the fourth output terminal;

a first peak frequency detection circuit that, in the second operation mode, measures a potential difference between the first output terminal and the second output terminal to detect a first peak frequency that is a frequency of the test signal at which an impedance of the first sound reproduction device reaches a peak;

a second peak frequency detection circuit that, in the second operation mode, measures a potential difference between the third output terminal and the fourth output terminal to detect a second peak frequency that is a frequency of the test signal at which an impedance of the second sound reproduction device reaches a peak; and a determination circuit that determines whether or not a difference between the first peak frequency and the second peak frequency is included in a predetermined reference frequency difference range.

2. The semiconductor device according to claim 1, wherein in the second operation mode, the first peak frequency detection circuit further detects a first peak voltage that is a voltage obtained by amplifying the potential difference between the first output terminal and the second output terminal when the frequency of the test signal is the first peak frequency, in the second operation mode, the second peak frequency detection circuit further detects a second peak voltage that is a voltage obtained by amplifying the potential difference between the third output terminal and the fourth output terminal when the frequency of the test signal is the second peak frequency, and the determination circuit further determines whether or not a difference between the first peak voltage and the second peak voltage is included in a predetermined reference voltage difference range.

3. The semiconductor device according to claim 1, wherein in the second operation mode, the first peak frequency detection circuit detects the first peak frequency by measuring a time when the potential difference between the first output terminal and the second output terminal reaches a maximum, and in the second operation mode, the second peak frequency detection circuit detects the second peak frequency by measuring a time when the potential difference between the third output terminal and the fourth output terminal reaches a maximum.

4. The semiconductor device according to claim 3, wherein the first peak frequency detection circuit includes a first differential low-pass filter to which a voltage of the first output terminal and a voltage of the second output terminal are input, a first A/D conversion circuit that converts an output voltage of the first differential low-pass filter into a digital signal, and a first peak time measurement circuit that measures the time when the potential difference between the first output terminal and the second output terminal reaches the maximum, based on the digital signal output from the first A/D conversion circuit, and the second peak frequency detection circuit includes a second differential low-pass filter to which a voltage of the third output terminal and a voltage of the fourth output terminal are input, a second A/D conversion circuit that converts an output voltage of the second differential low-pass filter into a digital signal, and a second peak time measurement circuit that measures the time when the potential difference between the third output terminal and the fourth output terminal reaches the maximum, based on the digital signal output from the second A/D conversion circuit.

5. The semiconductor device according to claim 4, wherein a cutoff frequency of the first differential low-pass filter and a cutoff frequency of the second differential low-pass filter are higher than a maximum frequency of the frequency band.

6. An electronic apparatus comprising:

the semiconductor device according to claim 1;

the first sound reproduction device; and the second sound reproduction device.

7. The electronic apparatus according to claim 6, wherein a volume of a sound reproduced by each of the first sound reproduction device and the second sound reproduction device in the second operation mode is smaller than a minimum value of a volume of a sound reproduced by each of the first sound reproduction device and the second sound reproduction device in the first operation mode.

* * * * *